(12) United States Patent
Marks et al.

(10) Patent No.: US 7,816,480 B2
(45) Date of Patent: *Oct. 19, 2010

(54) SILOLE-BASED POLYMERS AND SEMICONDUCTOR MATERIALS PREPARED FROM THE SAME

(75) Inventors: Tobin J. Marks, Evanston, IL (US); Antonio Facchetti, Chicago, IL (US); Gang Lu, Skokie, IL (US); Hakan Usta, Evanston, IL (US); Joseph Letizia, Philadelphia, PA (US)

(73) Assignee: Northwestern University, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/563,680

(22) Filed: Sep. 21, 2009

(65) Prior Publication Data

US 2010/0024883 A1    Feb. 4, 2010

(51) Int. Cl.
*C08G 77/04* (2006.01)
(52) U.S. Cl. .......................... 528/37; 528/377
(58) Field of Classification Search ............... 528/377
See application file for complete search history.

(56) References Cited

U.S. PATENT DOCUMENTS

| | | |
|---|---|---|
| 2003/0162053 A1 | 8/2003 | Marks et al. |
| 2003/0168656 A1* | 9/2003 | Kobayashi et al. ............ 257/40 |
| 2006/0186401 A1 | 8/2006 | Marks et al. |
| 2008/0087324 A1 | 4/2008 | Gaudiana et al. |
| 2008/0121281 A1 | 5/2008 | Gaudiana et al. |

FOREIGN PATENT DOCUMENTS

WO     2006/128352     12/2006

OTHER PUBLICATIONS

Ohshita et al. (Macromol. Chem. Phys. 201,851-857, 2000).*
Chan et al., "Poly(2,7-dibenzosilole): a Blue Light Emitting Polymer," *J. Am. Chem. Soc.*, 127: 7662-7663 (2005).
Chen et al., "Synthesis and Study of Conjugated Polymers Containing Silole Units," *Polymer Preprints*, 38(1):189-190 (1997).
Liu et al., "Efficient Green-light-emitting Diodes from Silole-containing Copolymers," *Chem. Mater.*, 15:3496-3500 (2003).
Ohshita et al., "Synthesis and properties of dithienosiloles," *J. Org. Chem.*, 553:487-491 (1998).
Ohshita et al., "Synthesis and Optical, Electrochemical, and Electron-transporting Properties of Silicon-bridged Bithiophenes," *Organometallics*, 18:1453-1459 (1999).

(Continued)

*Primary Examiner*—Randy Gulakowski
*Assistant Examiner*—Shane Fang
(74) *Attorney, Agent, or Firm*—K&L Gates LLP

(57) ABSTRACT

The present teachings provide silole-based polymers that can be used as p-type semiconductors. More specifically, the present teachings provide polymers that include a repeating unit of Formula I:

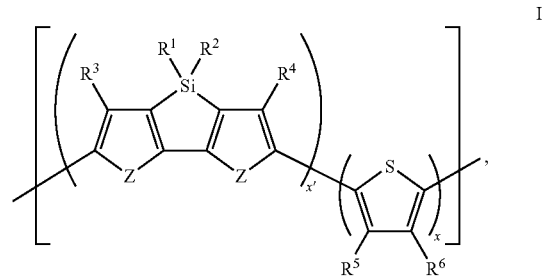

wherein $R^1$, $R^2$, $R^3$, $R^4$, $R^5R^6$, Z, x, and x' are as defined herein. The present teachings also provide methods of preparing these polymers, and relate to various compositions, composites, and devices that incorporate these polymers.

22 Claims, 9 Drawing Sheets

OTHER PUBLICATIONS

Ohshita et al., "Synthesis of Novel Spiro-condensed Dithienosiloles and the Application to Organic FET," *Chem. Lett.*, 33(7):892-893 (2004).

Ohshita et al., "Synthesis of Polymers Composed of Alternating Diphenylenedithienosilole and Diethynylenesilylene Units and Their Applications to Hole Transport in Double-Layer EL Devices," *Macromolecules*, 33:8890-8893 (2000).

Sirringhaus et al., "Mobility Enhancement in Conjugated Polymer Field-effect Transistors through Chain Alignment in a Liquid-crystalline Phase," *Appl. Phys. Lett.*, 77(3):406-408 (2000).

Tamao et al., "Silole Derivatives as Efficient Electron Transporting Materials," *J. Am. Chem. Soc.*, 118:11974-11975 (1996).

Tamao et al., "Silole-pyrrole Co-oligomers: Their Synthesis, Structure and UV-VIS Absorption Spectra," *Chem. Commun.*, 1873-1874 (1996).

Usta et al., "Dithienosilole- and Dibenzosilole-thiophene Copolymers as Semiconductors for Organic Thin-Film Transistors," *J. Am. Chem. Soc.*, 128: 9034-9035 (2006).

Wang et al., "Conjugated Fluorene and Silole Copolymers: Synthesis, Characterization, Electronic Transition, Light Emission, Photovoltaic Cell, and Field Effect Hole Mobility," *Macromolecules*, 38: 2253-2260 (2005).

Wang et al., "Conjugated Silole and Carbazole Copolymers: Synthesis, Characterization, Single-Layer Light-Emitting Diode, and Field Effect Carrier Mobility," *Macromol. Chem. Phys.*, 206: 2190-2198 (2005).

Yamaguchi et al., "Silole-containing $\sigma$- and $\pi$- Conjugated Compounds," *J. Chem. Soc., Dalton Trans.*, 3693-3702 (1998).

Yamaguchi et al., "Theoretical Study of the Electronic Structure of 2,2'-Bisilole in Comparison with 1,1'-Bi-1,3-cyclopentadiene: $\sigma^*$-$\pi^*$ Conjugation and a Low-lying Lumo as the Original of the Unusual Optical Properties of 3,3',4,4'-Tetraphenyl-2,2'-bisilole," *Bull. Chem. Soc. Jpn.*, 69:2327-2334 (1996).

\* cited by examiner

A

B

C

A

B

A

B

A

B

SILOLE-BASED POLYMERS AND SEMICONDUCTOR MATERIALS PREPARED FROM THE SAME

STATEMENT REGARDING FEDERALLY SPONSORED RESEARCH OR DEVELOPMENT

This invention, in part, was made with Government support under Grant No. 521-0077-050-A1/NCC2-1363 awarded by the National Aeronautics & Space Administration; Grant No. DMR-0076097 awarded by the National Science Foundation; and Grant Nos. N00014-02-1-0909 and N00014-05-1-0021 awarded by the Office of Naval Research, all to Northwestern University. The United States Government has certain rights in this invention.

CROSS REFERENCE TO RELATED APPLICATIONS

This application is a continuation of U.S. patent application Ser. No. 11/803,020, filed on May 11, 2007, which claims priority to and the benefit of U.S. Provisional Patent Application Ser. No. 60/799,520, filed on May 11, 2006, the disclosure of each of which is incorporated by reference in its entirety.

BACKGROUND

π-Conjugated oligomeric and polymeric semiconductors have been the focus of intense research over the past three decades as potential alternatives to inorganic semiconductors for low-cost electronic components, such as organic thin-film transistors (OTFTs), light-emitting diodes (OLEDs), and photovoltaics. See, e.g., Dimitralopoulos, C. D. et al. *Adv. Mater.*, 14: 99-117 (2002); Horowitz, G. et al., *Adv. Mater.*, 10:365-377 (1998); Katz, H. E., *Chem. Mater.*, 16: 4748-4756 (2004); Sirringhaus, H. et al., *Science*, 280: 1741-1744 (1998); Bernius, M. et al., *Thin Solid Films*, 363: 55-57 (2000); Kraft, A. et al., *Angew. Chem., Intl. Ed. Engl.*, 37: 402-428 (1998); Kulkarni, A. P. et al., *Chem. Mater.*, 16: 4556-4573 (2004); and Alam, M. M. et al., *Chem. Mater.*, 16: 4647-4656 (2004). OTFTs can be used in low-performance memory elements, sensors, and as drive devices for active-matrix displays. See, e.g., Huitema, H. E. A. et al., *Adv. Mater.*, 14: 1201-1204 (2002); Kitamura, M. et al., *Jpn. J. Appl. Phys., Part 1*, 42: 2483-2487 (2003); and Mach, P. et al., *Appl. Phys. Lett.*, 78: 3592-3594 (2001). OLEDs are envisioned as cheap, energy-efficient alternatives to liquid crystal displays, and flat-panel displays based on OLEDs are emerging in commercial portable electronic devices and in novel textiles. Organic semiconductors enable vapor phase or solution fabrication of low-cost, large-area, light-weight electronic devices, and are compatible with plastic substrates for flexible, conformable, and wearable electronics.

Among the organic semiconductor classes used for OTFTs, (oligo, poly)-thiophenes have been among the most extensively investigated. The hole transporting properties of α-sexithiophene (α-6T) was first reported in 1988. See, e.g., Fichou, D. et al., *Chemtronics*, 3: 176-178 (1988). One year later, p-type OTFT devices fabricated from thermally evaporated α-6T thin films were reported. See, e.g., Horowitz, G. et al., *Solid State Commun.*, 72: 381-384 (1989); and Horowitz, G. et al., *Appl. Phys. Lett.*, 57: 2013-2015 (1990). The highest mobilities obtained in OTFT devices using vapor-deposited thin films currently approach those measured for α-6T single crystals (t=0.16 cm$^2$/Vs). See, e.g., Horowitz, G. et al., *Euro. Phys. J. Appl. Phys.*, 1: 361-367 (1998). To fully realize organic electronics via complementary circuits, high-performance electron-transporting (n-type) oligothiophenes have also been developed. See, Facchetti, A. et al., *Chem. Mater.*, 16: 4715-4727 (2004); Facchetti, A. et al., *J. Am. Chem. Soc.*, 126: 13859-13874 (2004); Facchetti, A. et al., *J. Adv. Mater.*, 17: 1705-1725 (2005); Facchetti, A. et al., *J. Am. Chem. Soc.*, 126: 13480-13501 (2004); Facchetti, A. et al., *Angew. Chem., Intl. Ed. Engl.*, 42: 3900-3903 (2003); Jones, B. A. et al., *Angew. Chem.*, Intl. Ed. Engl., 43: 6363-6366 (2004); Yoon, M. H. et al., *J. Am. Chem. Soc.*, 127: 1348-1349 (2005); and Yoon, M. H. et al., *J. Am. Chem. Soc.*, 128: 5792-5801 (2006). However, OTFT devices based on the oligothiophenes often exhibit significantly lower mobilities when the films are grown from solution, presumably reflecting difficulties in creating high levels of structural ordering from solution. Therefore, the intrinsic inefficiency of alternative vacuum vapor phase film growth processes renders the oligothiophenes less appealing as active channel materials in OTFTs.

In order to take full advantage of the cost efficiencies of solution processing methods such as spin-coating, stamping, or inkjet printing, polymeric organic semiconductors would seem to be the materials of choice. Among polythiophenes, soluble regioregular polythiophenes, such as poly(3-hexylthiophene) (P3HT) and variants, see, e.g., Bao, Z. et al., *Appl. Phys. Lett.*, 69: 4108-4110 (1996); Bao, Z. et al., *Chem. Mater.*, 11: 2607-2612 (1999); Merlo, J. A. et al., *J. Polym. Sci., Part B: Polym. Phys.*, 41: 2674-2680 (2003); Sirringhaus, H. et al., *Synth. Mat.*, 202: 857-860 (1999); and Sirringhaus, H. et al., *Nature*, 401: 685-688 (1999), are the most commonly used in OTFT applications due to their high charge-carrier mobilities and chemical availability. Despite recent advances, one of the major drawbacks of commonly used polythiophenes is their poor stability in air. This shortcoming has been particularly acute when these materials are used as the active layers in OTFTs. Doping of polythiophenes by reaction with ambient O$_2$ often results in large off-currents and thus lower current on/off ratios ($I_{on}/I_{off}$), as well positive shifts in the threshold voltage for the transistors fabricated from these materials. See, e.g., Meijer, E. J. et al., *J. Appl. Phys.*, 93: 4831-4835 (2003). Therefore, precautions must be taken during materials synthesis and device fabrication to exclude O$_2$. These constraints render polythiophene-based OTFTs less attractive as cheap alternatives to silicon-based chips, and there is a great need to develop semiconducting polymers with both high carrier mobility and enhanced air stability.

Silicon substituents have long been known to stabilize adjacent carbanions because of their strongly electron-withdrawing character. See, e.g., Wetzel, D. M. et al., *J. Am. Chem. Soc.*, 110: 8333-8336 (1988). Among the various silicon-containing π-conjugated systems, silole (sila-2,4-cyclopentadiene) polymers have recently attracted broad attention as novel conjugated systems in which the Si—C σ*-orbital effectively interacts with the π*-orbital of the butadiene fragment, leading to a low-lying LUMO and relatively small band gaps. See, e.g., Risko, C. et al., *J. Chem. Phys.*, 121: 9031-9038 (2004); Yamaguchi, S. et al., *J. Chem. Soc., Dalton Trans.*, 3693-3702 (1998); Zhan, X. W. et al., *J. Am. Chem. Soc.*, 127: 9021-9029 (2005); and Yamaguchi, S. et al., *Bull. chem. Soc., Jpn.*, 69: 2327-2334 (1996). Additionally, the introduction of silicon also results in stabilization of the silole HOMO level, compared to their carbon counterparts, which should, a priori, help to improve the ambient stability of silole-containing polymers in OFET devices. To date, however, the use of silole derivatives has been limited to electron-transporting materials in OLEDs and solar cells. See, e.g., Chan, K. L. et al., *J. Am. Chem. Soc.*, 127: 7662-7663 (2005);

Chen, H. Y. et al., *Appl. Phys. Lett.,* 81: 574-576 (2002); Chen, J. W. et al., *Chem. Mater.,* 15: 1535-1546 (2003); Kim, W. et al., *Chem. Mater.,* 16: 4681-4686 (2004); Liu, M. S. et al., *Chem. Mater.,* 15: 3496-3500 (2003); Luo, J. D. et al., *Chem. Commun.,* 1740-1741 (2001); Murata, H. et al., *Appl. Phys. Lett.,* 80: 189-191 (2002); Tamao, K. et al., *Chem. Commun.,* 1873-1874 (1996); Tamao, K. et al, *J. Am. Chem. Soc.,* 118: 11974-11975 (1996); Ohshita, *J. et al., Organometallics,* 18: 1453-1459 (1999); and Mi, B. X. et al, *Chem. Commun.,* 3583-3585 (2005). Not until very recently have silole-containing polymers been used as the active layers in OTFTs. See, e.g., Ohshita, J. et al, *Chem. Lett.,* 33: 892-893 (2004); Wang, Y. et al, *Macromol. Chem. Phys.,* 206: 2190-2198 (2005); and Wang, F. et al, *Macromolecules,* 38: 2253-2260 (2005). Nevertheless, the performance of the reported materials is generally poor in regard to both carrier mobility and $I_{on}/I_{off}$, probably because steric hindrance between large substituents at the 3 and 4 positions of the thiophene interferes with the close π-π stacking requisite for efficient charge transport.

SUMMARY

In light of the foregoing, the present teachings provide organic semiconductor materials and associated compositions, composites, and/or devices that can address various deficiencies and shortcomings of the state-of-the-art, including those outlined above.

More specifically, the present teachings provide new conjugated polymeric compounds that include silole-containing cyclic moieties to promote desired semiconductor activity. Such conjugated polymeric compounds can be used to prepare organic semiconductor materials.

In some embodiments, the present teachings provide polymers (or polymeric compounds) that include a repeating unit of Formula I:

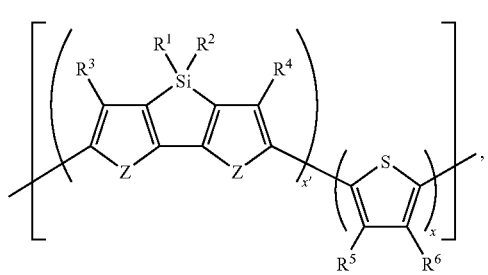

wherein $R^1$, $R^2$, $R^3$, $R^4 R^5$, $R^6$, Z, x, and x' are as defined herein.

The present teachings also provide methods of preparing such polymers, as well as semiconductor materials and various compositions, composites, and devices that incorporate the polymers disclosed herein.

The foregoing as well as other features and advantages of the present teachings, will be more fully understood from the following figures, description, and claims.

BRIEF DESCRIPTION OF DRAWINGS

It should be understood that the drawings described below are for illustration purpose only and are not intended to limit the scope of the present teachings in any way.

DETAILED DESCRIPTION

Figure 1:
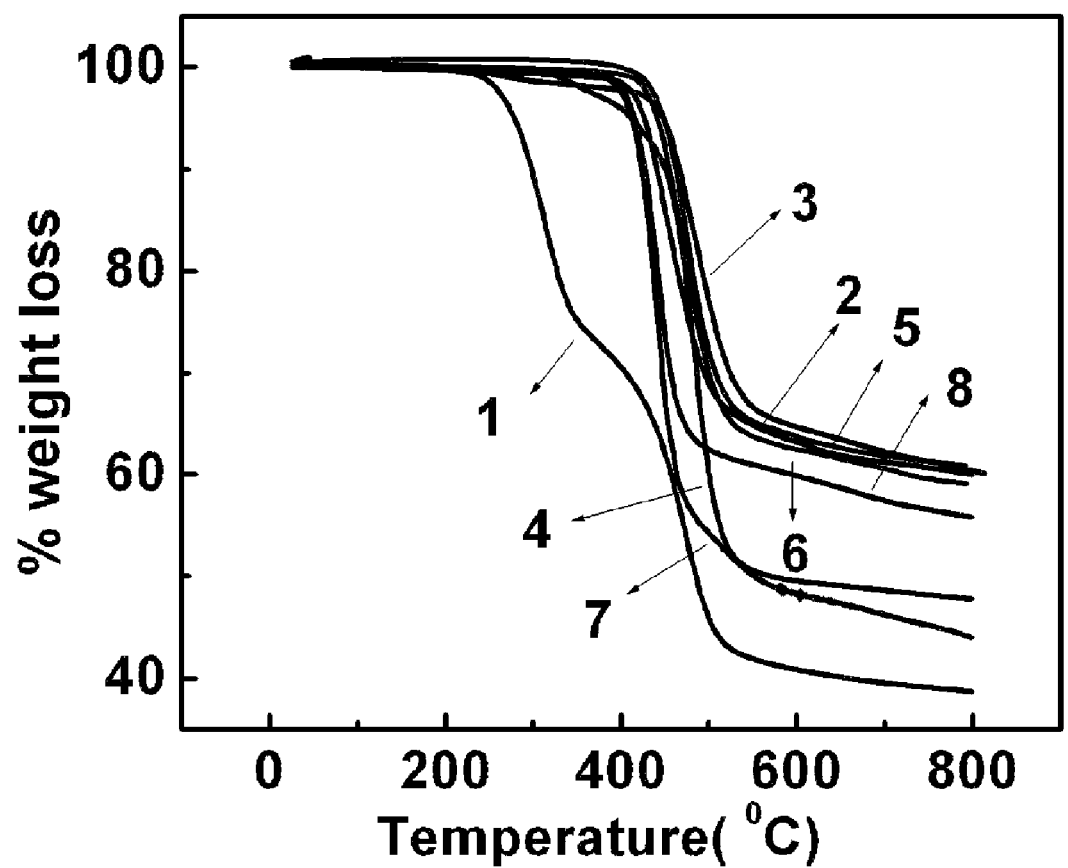
FIG. 1 shows the thermogravimetric analysis (TGA) curves of certain embodiments of the polymers of the present teachings (i.e., polymers 1-8).

The present teachings relate to organic semiconductor materials based upon a conjugated polymeric system that includes silole-containing cyclic moieties. More specifically, the present teachings relate to polymers that include silole-containing cyclic moieties in at least one of their repeating units. The present polymers can be prepared in relatively high yields and can provide solution-processable films that can be used as thin film semiconductors. The combination of good processability and air stability allows the use of the present polymers in low-cost printed electronics among other applications. The present teachings further relate to methods for preparing these polymers, as well as to compositions, composites, materials, articles, structures, and devices that incorporate such polymers.

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components. The use of the term "include" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

As used herein, "polymer" refers to a molecule including two or more (e.g., three or more, five or more, ten or more and so forth) repeating units connected by covalent chemical bonds. The polymer or polymeric compound can have only one type of repeating unit as well as two or more types of different repeating units. In the former case, the polymer can be referred to as a homopolymer. In the latter case, the term "copolymer" or "copolymeric compound" can be used herein instead, especially when the polymer includes chemically significantly different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, "silole-containing cyclic moiety" refers to:

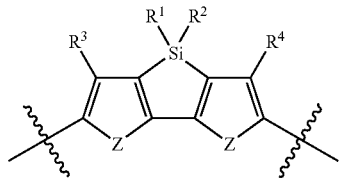

wherein $R^1$, $R^2 R^3$, $R^4$, and Z are as defined herein.

As used herein, "solution-processable" refers to compounds, materials, or compositions that can be used in various solution-phase processes including, but not limited to, spin-coating, printing (e.g., inkjet printing), spray coating, electrospray coating, drop casting, dip coating, and blade coating.

As used herein, "halo" or "halogen" refers to fluoro, chloro, bromo, and iodo.

As used herein, "amino" refers to —$NH_2$, an —NH-alkyl group, an —N(alkyl)$_2$ group, and an —NH(-L-$C_{6-14}$ aryl) group, an —N($C_{1-20}$ alkyl)(-L-$C_{6-14}$ aryl) group, an —N(-L-$C_{6-14}$ aryl)$_2$ group, where L is a divalent $C_{1-20}$ alkyl group, a divalent $C_{2-20}$ alkenyl group, a divalent $C_{2-20}$ alkynyl group, or a covalent bond.

As used herein, "alkoxy" refers to an —O-alkyl group or an —O-L-$C_{6-14}$ aryl group, where L is as defined herein. Examples of alkoxy groups include, but are not limited to, methoxy, ethoxy, propoxy (e.g., n-propoxy and isopropoxy), t-butoxy groups, and the like.

As used herein, "alkylthio" refers to an —S-alkyl group or an —S-L-$C_{6-14}$ aryl group, where L is as defined herein. Examples of alkylthio groups include, but are not limited to, methylthio, ethylthio, propylthio (e.g., n-propylthio and isopropylthio), t-butylthio groups, and the like.

As used herein, "ester" refers to an —O—C(O)-alkyl group, a —C(O)—O-alkyl group, an —O—C(O)-L-$C_{6-14}$ aryl group, and a —C(O)—O-L-$C_{6-14}$ aryl group, where L is as defined herein.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl), and the like. In various embodiments, an alkyl group can have 1 to 20 carbon atoms, i.e., a $C_{1-20}$ alkyl group. In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In some embodiments, alkyl groups can be substituted as disclosed herein. An alkyl group is generally not substituted with another alkyl group or an alkenyl or alkynyl group.

As used herein, "haloalkyl" refers to an alkyl group having one or more halogen substituents. Examples of haloalkyl groups include, but are not limited to, $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula —$C_iX_{2i}$— or —$C_iH_{2i-j}X_j$—, wherein X is F, Cl, Br, or I, i is an integer in the range of 1 to 20, and j is an integer in the range of 0 to 40, provided that i is less than or equal to 2j. Haloalkyl groups that are not perhaloalkyl groups can be optionally substituted as disclosed herein.

As used herein, "arylalkyl" refers to an -alkyl-aryl group, wherein the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group can be substituted as disclosed herein.

As used herein, "alkenyl" refers to a straight-chain or branched alkyl group having one or more carbon-carbon double bonds. Examples of alkenyl groups include, but are not limited to, ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 20 carbon atoms, i.e., a $C_{2-20}$ alkenyl group. In some embodiments, alkenyl groups can be substituted as disclosed herein. An alkenyl group is generally not substituted with another alkenyl group or an alkyl or alkynyl group.

As used herein, "alkynyl" refers to a straight-chain or branched alkyl group having one or more triple carbon-carbon bonds. Examples of alkynyl groups include, but are not limited to, ethynyl, propynyl, butynyl, pentynyl, and the like. The one or more triple carbon-carbon bonds can be internal (such as in 2-butyne) or terminal (such as in 1-butyne). In various embodiments, an alkynyl group can have 2 to 20 carbon atoms, i.e., a $C_{2-20}$ alkynyl group. In some embodiments, alkynyl groups can be substituted as disclosed herein. An alkynyl group is generally not substituted with another alkynyl group or an alkyl or alkenyl group.

As used herein, "cycloalkyl" refers to a non-aromatic carbocyclic group including cyclized alkyl, alkenyl, and alkynyl groups. A cycloalkyl group can be monocyclic having 3-14 ring member carbon atoms (e.g., cyclohexyl) or polycyclic having 4-14 ring member carbon atoms (e.g., containing fused, bridged, and/or spiro ring systems), wherein the carbon atoms are located inside or outside of the ring system. Any suitable ring position of the cycloalkyl group can be covalently linked to the defined chemical structure. Examples of cycloalkyl groups include, but are not limited to, cyclopropyl, cyclopropylmethyl, cyclobutyl, cyclopentyl, cyclohexyl, cyclohexylmethyl, cyclohexylethyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as disclosed herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, N and S, and optionally contains one or more double or triple bonds. A cycloheteroalkyl group can be monocyclic having 3-14 ring member atoms, at least one of which is selected from O, N, and S, or polycyclic having 4-14 ring member atoms, at least one of which is selected from O, S, and S. A polycyclic cycloheteroalkyl group can contain fused, bridged, and/or spiro ring systems. One or more N or S atoms in a cycloheteroalkyl ring can be oxidized (e.g., morpholine N-oxide, thiomorpholine S-oxide, thiomorpholine S,S-dioxide). In some embodiments, nitrogen atoms of cycloheteroalkyl groups can bear a substituent, for example, a hydrogen atom, an alkyl group, or other substituents as described herein. Cycloheteroalkyl groups can also contain one or more oxo groups, such as piperidone, oxazolidinone, pyrimidine-2,4(1H,3H)-dione, pyridin-2(1H)-one, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl pyrrolinyl, tetrahydrofuranyl, tetrahydrothiophenyl, piperidinyl, piperazinyl, and the like. In some embodiments, cycloheteroalkyl groups can be substituted as disclosed herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 14 carbon atoms in its ring system, which can include multiple fused rings. In some embodiments, a polycyclic aryl group can have from 7 to 14 carbon atoms. Any suitable ring position of the aryl group can be covalently linked to the defined chemical structure. Examples of aryl groups having only aromatic carbocyclic ring(s) include, but are not limited to, phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 5,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include, but are not limited to, benzodioxanyl, benzodioxolyl, chromanyl, indolinyl groups, and the like. In some embodiments, aryl groups can be substituted as disclosed herein. In some embodiments, an aryl group can have one or more halogen substituents, and can be referred to as a "haloaryl" group. Perhaloaryl groups, i.e., aryl groups wherein all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least 1 ring heteroatom selected from oxygen (O), nitrogen (N) and sulfur (S) or a polycyclic ring system where at least one of the rings present in the ring system is aromatic and contains at least 1 ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, from 5 to 14 ring atoms and contain 1-5 ring heteroatoms. The heteroaryl group can be attached to the defined chemical structure at any heteroatom or carbon atom that results in a stable structure. Generally, heteroaryl rings do not contain 0-O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5-membered monocyclic and 5-6 bicyclic ring systems shown below:

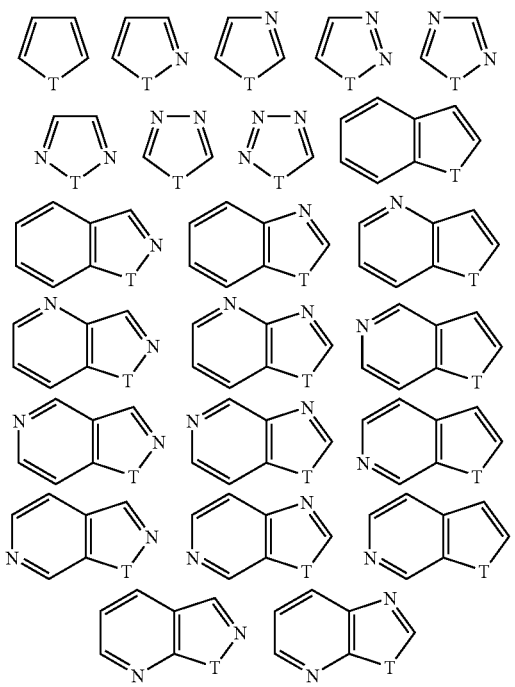

where T is O, S, NH, N-alkyl, N-aryl, or N-(arylalkyl) (e.g., N-benzyl). Examples of such heteroaryl rings include, but are not limited to, pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyrdazinyl, thienothiazolyl, thienoxazolyl, thienoimidazolyl groups, and the like. Further examples of heteroaryl groups include, but are not limited to, 4,5,6,7-tetrahydroindolyl, tetrahydroquinolinyl, benzothienopyridinyl, benzofuropyridinyl groups, and the like. In some embodiments, heteroaryl groups can be substituted as disclosed herein.

Compounds of the present teachings can include a "divalent group" defined herein as a linking group capable of forming a covalent bond with two other moieties. For example, compounds of the present teachings can include a divalent $C_{1-20}$ alkyl group, such as, for example, a methylene group.

At various places in the present specification, substituents of compounds are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-4 substituents" is specifically intended to individually disclose a chemical group that can include 0, 1, 2, 3, 4, 0-4, 0-3, 0-2, 0-1, 1-4, 1-3, 1-2, 2-4, 2-3, and 3-4 substituents.

Throughout the specification, structures may or may not be presented with chemical names. Where any question arises as to nomenclature, the structure prevails.

In one aspect, the present teachings provide polymers that include a repeating unit of Formula I:

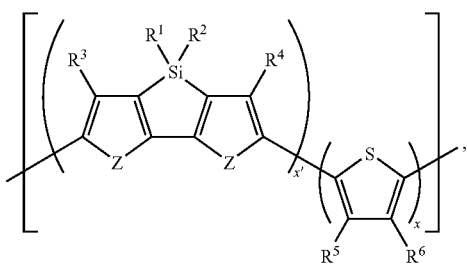

I wherein:

Z is a) S, b) Se, c) Te, d) $NR^7$, e) N=N, f) C(O), or g) $CR^8$=$CR^9$;

$R^1$ and $R^2$ independently are a) H, b) a $C_{1-20}$ alkyl group, c) a $C_{2-20}$ alkenyl group, d) a $C_{2-20}$ alkynyl group, e) a $C_{1-20}$ haloalkyl group, f) a —Y—$C_{3-14}$ cycloalkyl group, g) a —Y—$C_{6-14}$ aryl group, h) a —Y-3-14 membered cycloheteroalkyl group, or i) a —Y-5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^3$, $R^4$, $R^5$, and $R^6$ independently are a) H, b) halogen, c) —CN, d) —$NO_2$, e) —OH, f) —$NH_2$, g) —SH, h) —C(O)OH, i) —C(O)$NH_2$, j) —S(O)$_2$OH, k) —O$C_{1-20}$ alkyl, l) —NH—$C_{1-20}$ alkyl, m) —N($C_{1-20}$ alkyl)$_2$, n) —C(O)—$C_{1-20}$ alkyl, o) —C(O)—O$C_{1-20}$ alkyl, p) —C(O)NH—$C_{1-20}$ alkyl, q) —C(O)N($C_{1-20}$ alkyl)$_2$, r) —S(O)$_m$—$C_{1-20}$ alkyl, s) —S(O)$_m$—O$C_{1-20}$ alkyl, t) —S(O)$_m$—NH$C_{1-20}$ alkyl, u) —S(O)$_m$—N($C_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^7$ is a) H, b) a $C_{1-20}$ alkyl group, c) a $C_{2-20}$ alkenyl group, d) a $C_{2-20}$ alkynyl group, e) a $C_{1-20}$ haloalkyl group, f) a —Y—$C_{3-14}$ cycloalkyl group, g) a —Y—$C_{6-14}$ aryl group, h) a —Y-3-14 membered cycloheteroalkyl group, or i) a —Y-5-14 membered heteroaryl group;

wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^8$ and $R^9$ independently are a) H, b) halogen, c) —CN, d) —$NO_2$, e) —OH, f) —$NH_2$, g) —SH, h) —C(O)OH, i) —C(O)$NH_2$, j) —S(O)$_2$OH, k) —O$C_{1-20}$ alkyl, l) —NH—$C_{1-20}$ alkyl, m) —N($C_{1-20}$ alkyl)$_2$, n) —C(O)—$C_{1-20}$ alkyl, o) —C(O)—O$C_{1-20}$ alkyl, p) —C(O)NH—$C_{1-20}$ alkyl, q) —C(O)N($C_{1-20}$ alkyl)$_2$, r) —S(O)$_m$—$C_{1-20}$ alkyl, s) —S(O)$_m$—O$C_{1-20}$ alkyl, t) —S(O)$_m$—NH$C_{1-20}$ alkyl, u) —S(O)$_m$—N($C_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^{10}$, at each occurrence, independently is a) halogen, b) —$NO_2$, c) —CN, d) oxo, e) —OH, f) —$NH_2$, g) —SH, h) —C(O)OH, i) —C(O)$NH_2$, j) —S(O)$_2$OH, k) —O$C_{1-20}$ alkyl, l) —NH—$C_{1-20}$ alkyl, m) —N($C_{1-20}$ alkyl)$_2$, n) —C(O)—$C_{1-20}$ alkyl, o) —C(O)—O$C_{1-20}$ alkyl, p) —C(O)NH—$C_{1-20}$ alkyl, q) —C(O)N($C_{1-20}$ alkyl)$_2$, r) —S(O)$_m$—$C_{1-20}$ alkyl, s) —S(O)$_m$—O$C_{1-20}$ alkyl, t) —S(O)$_m$—NH$C_{1-20}$ alkyl, u) —S(O)$_m$—N($C_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group;

Y, at each occurrence, independently is a) a divalent $C_{1-20}$ alkyl group, b) a divalent $C_{2-20}$ alkenyl group, c) a divalent $C_{2-20}$ alkynyl group, d) a divalent $C_{1-20}$ haloalkyl group, or e) a covalent bond;

m, at each occurrence, independently is 0, 1, or 2;

x is 0, 1, 2, 3, 4, 5, 6, 7, 8, 9, or 10; and x' is 1, 2, 3, 4, 5, 6, 7, 8, 9, or 10.

In some embodiments, Z can be S, $NR^7$, N=N, C(O), or $CR^8$=$CR^9$, wherein $R^7$, $R^8$, and $R^9$ are as defined herein. In certain embodiments, Z can be S. In other embodiments, Z can be $CR^8$=$CR^9$, wherein $R^8$ and $R^9$ are as defined herein. For example, Z can be CH=CH.

In some embodiments, $R^1$ and $R^2$ independently can be H, a $C_{1-20}$ alkyl group, a $C_{2-20}$ alkenyl group, a $C_{2-20}$ alkynyl group, or a $C_{1-20}$ haloalkyl group, wherein each of the $C_{1-20}$ alkyl group, the $C_{2-20}$ alkenyl group, the $C_{2-20}$ alkynyl group, and the $C_{1-20}$ haloalkyl group can be optionally substituted with 1-4-Y—$R^{10}$ groups, wherein Y and $R^{10}$ are as defined herein. In certain embodiments, $R^1$ and $R^2$ independently can be a straight chain $C_{1-20}$ alkyl group, a branched $C_{1-20}$ alkyl group, a straight chain $C_{1-20}$ haloalkyl group, or a branched $C_{1-20}$ haloalkyl group, wherein each of these groups can be optionally substituted with 1-4-Y—$R^{10}$ groups. For example, each of $R^1$ and $R^2$ can be a $C_{1-20}$ alkyl group (straight chain or branched) including, but not limited to, a methyl group, an ethyl group, a propyl group, a butyl group, a pentyl group, a hexyl group, a heptyl group, an octyl group, a nonyl group, a decyl group, an undecyl group, or a dodecyl group. In particular embodiments, $R^1$ and $R^2$ independently can be a hexyl group or an octyl group.

In some embodiments, $R^3$, $R^4$, $R^5$, and $R^6$ independently can be H, halogen, —CN, —$NO_2$, —OH, —$NH_2$, —C(O)OH, —C(O)$NH_2$, —O$C_{1-20}$ alkyl, —NH—$C_{1-20}$ alkyl, —N($C_{1-20}$ alkyl)$_2$, —C(O)—$C_{1-20}$ alkyl, —C(O)—O$C_{1-20}$ alkyl, —C(O)NH—$C_{1-20}$ alkyl, —C(O)N($C_{1-20}$ alkyl)$_2$, a $C_{1-20}$ alkyl group, a $C_{2-20}$ alkenyl group, a $C_{2-20}$ alkynyl group, a $C_{1-20}$ haloalkyl group, a $C_{3-14}$ cycloalkyl group, a $C_{6-14}$ aryl group, a 3-14 membered cycloheteroalkyl group, or a 5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups, wherein Y and $R^{10}$ are as defined herein. In certain embodiments, at least one of $R^3$, $R^4$, $R^5$, and $R^6$ can be H.

In some embodiments, x can be 0, 1, 2, 3, 4, or 5. For example, x can be 0, 1, or 2. In embodiments where x is 0, the present polymers can be referred to as silole homopolymers. In embodiments where x>0, the present polymers can be referred to as silole-thiophene copolymers.

In some embodiments, x' can be 1, 2, 3, 4, or 5. In certain embodiments, x' can be 1.

In some embodiments, the polymers of the present teachings can include a repeating unit of Formula II:

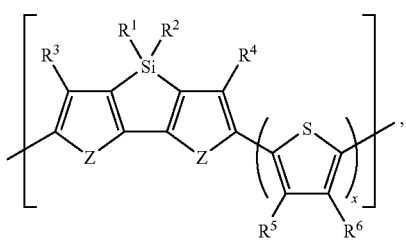

wherein $R^1$, $R^2$, $R^3$, $R^4$, $R^5$, $R^6$, Z, and x are as defined herein.

In some embodiments, each of $R^3$, $R^4$, $R^5$, and $R^6$ can be H. Accordingly, in some embodiments, polymers of the present teachings can include a repeating unit of Formula III:

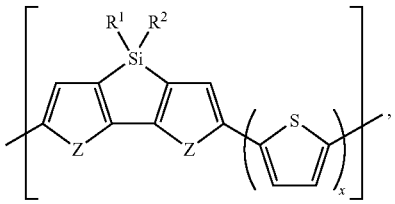

wherein $R^1$, $R^2$, Z, and x are as defined herein.

It should be understood that the present teachings can exclude certain embodiments of the polymers disclosed herein. For example, when Z is CH=CH and $R^1$ and $R^2$ are n-hexyl groups, the present teachings can exclude embodiments where x is 0 (i.e., in some embodiments, x can be 1, 2, 3, 4, 5, 6, 7, 8, 9, or 10 when Z is CH=CH and $R^1$ and $R^2$ are n-hexyl groups).

In some embodiments, the polymers disclosed herein can include (or consist essentially of) only one type of repeating unit, e.g., a repeating unit of Formula I, Formula II, or Formula III. Accordingly, in some embodiments, polymers of the present teachings can be represented by Formula I', Formula II', or Formula III':

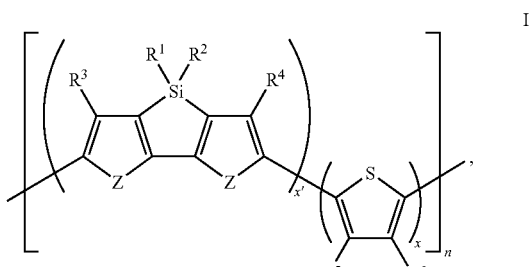

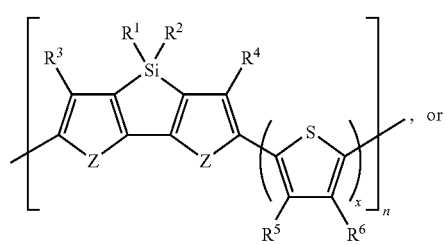

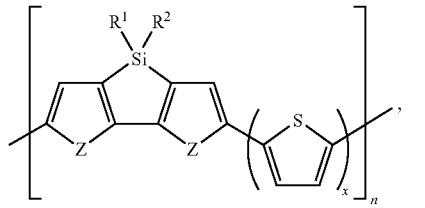

wherein $R^1$, $R^2$, $R^3$, $R^4$, $R^5$, $R^6$, Z, x, and x' are as defined herein, and n can be an integer in the range from 2 to about 500. In various embodiments, n can be an integer in the range from 10 to about 250, an integer in the range from 10 to about 200, an integer in the range from 10 to about 100, an integer in the range from 50 to about 250, an integer in the range from 50 to about 200, or an integer in the range from 50 to 100.

In some embodiments, the present teachings provide a polymer selected from:

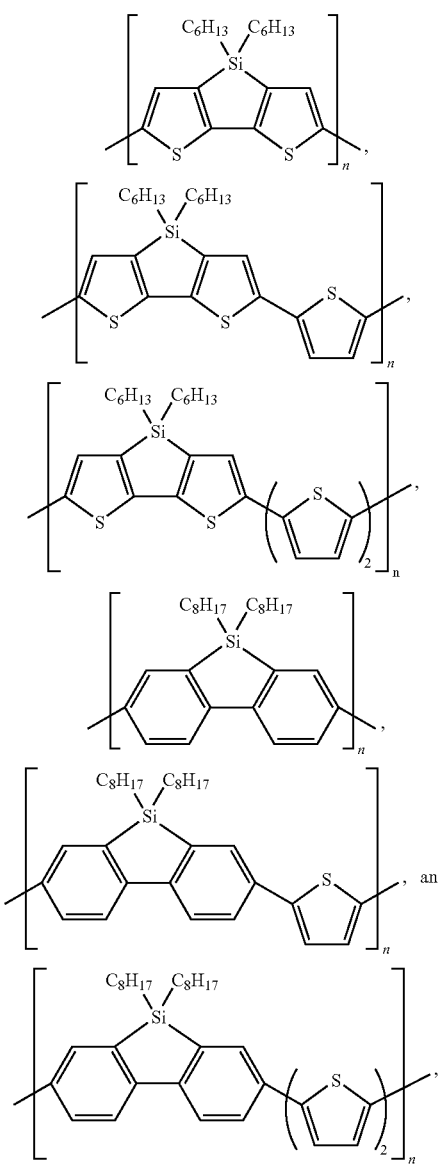

TS6 (1)
TS6T1 (2)
(TS6T2 (3))
BS8 (4)
BS8T1 (5), and
BS8T2 (6)

wherein n is as defined herein.

In other embodiments, the polymers of the present teachings can include one or more additional repeating units other than a repeating unit of Formula I, Formula II, or Formula III. In some embodiments, the additional repeating unit can have Formula IVa:

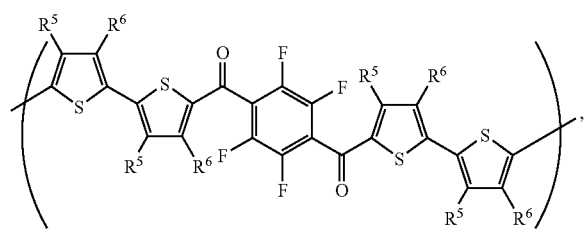

IVa wherein $R^5$ and $R^6$ are as defined herein.

In some embodiments, the additional repeating unit can have Formula IVb:

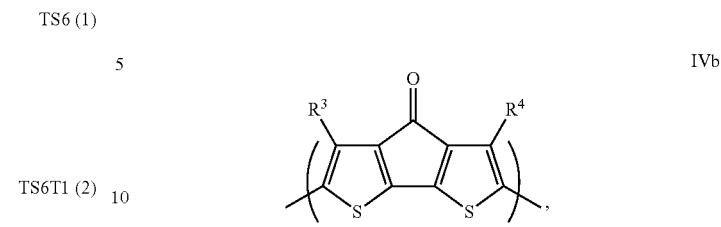

IVb wherein $R^3$ and $R^4$ are as defined herein.

Additional repeating units IVa and IVb can be prepared as described in co-pending U.S. patent application Ser. No. 11/227,559, filed on Sep. 14, 2005, the entirety of which is incorporated by reference herein. Additional repeating unit IVa (as can be varied by the number of associated diacyl moieties and/or thiophene moieties) and additional repeating unit IVb can be coupled to any of the silole-containing cyclic moieties disclosed herein.

In some embodiments, the additional repeating unit can have Formula IVc, Formula IVd, or Formula IVe:

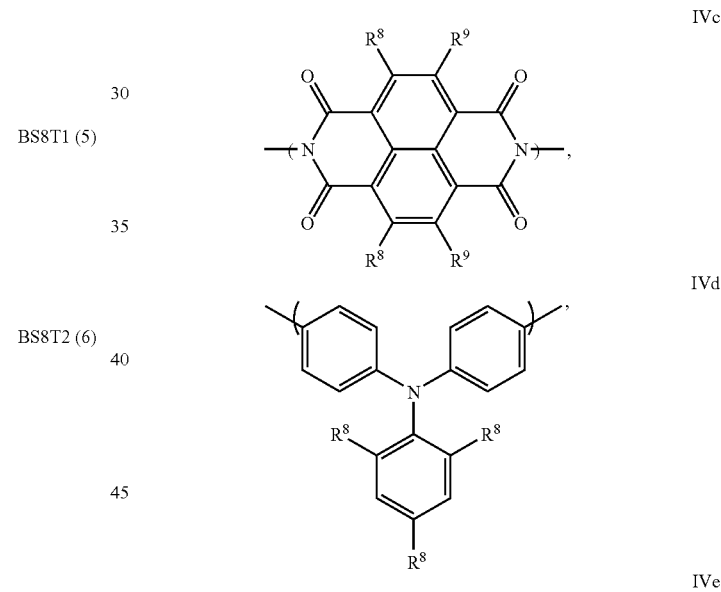

IVc

IVd

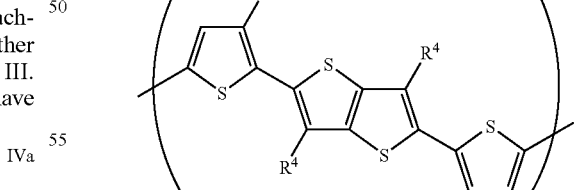

IVe wherein $R^3$, $R^4$, $R^8$ and $R^9$ are as defined herein.

Additional repeating unit IVc and mono-imide variations thereof can be prepared as described in co-pending U.S. patent application Ser. No. 11/043,814, filed on Jan. 26, 2005, the entirety of which is incorporated by reference herein. Perylene mono- or diimides similar to the repeating unit of Formula IVc can also be used as an additional repeating unit for coupling to any of the silole-containing cyclic moieties disclosed herein.

Additional repeating units IVd and IVe can be prepared according to procedures known in the art. See, e.g., McCulloch, I. et al., *Nature Materials*, 5(4): 328-333 (2006); European Patent No. EP 1 394 188; and International Publication No. WO 2007/020954.

Polymers of the present teachings can be prepared in accordance with the procedures outlined in the schemes below, from commercially available starting materials, compounds known in the literature, or readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Polymers of Formula I' (and also Formula II' and Formula III') can be prepared according to Scheme 1 below.

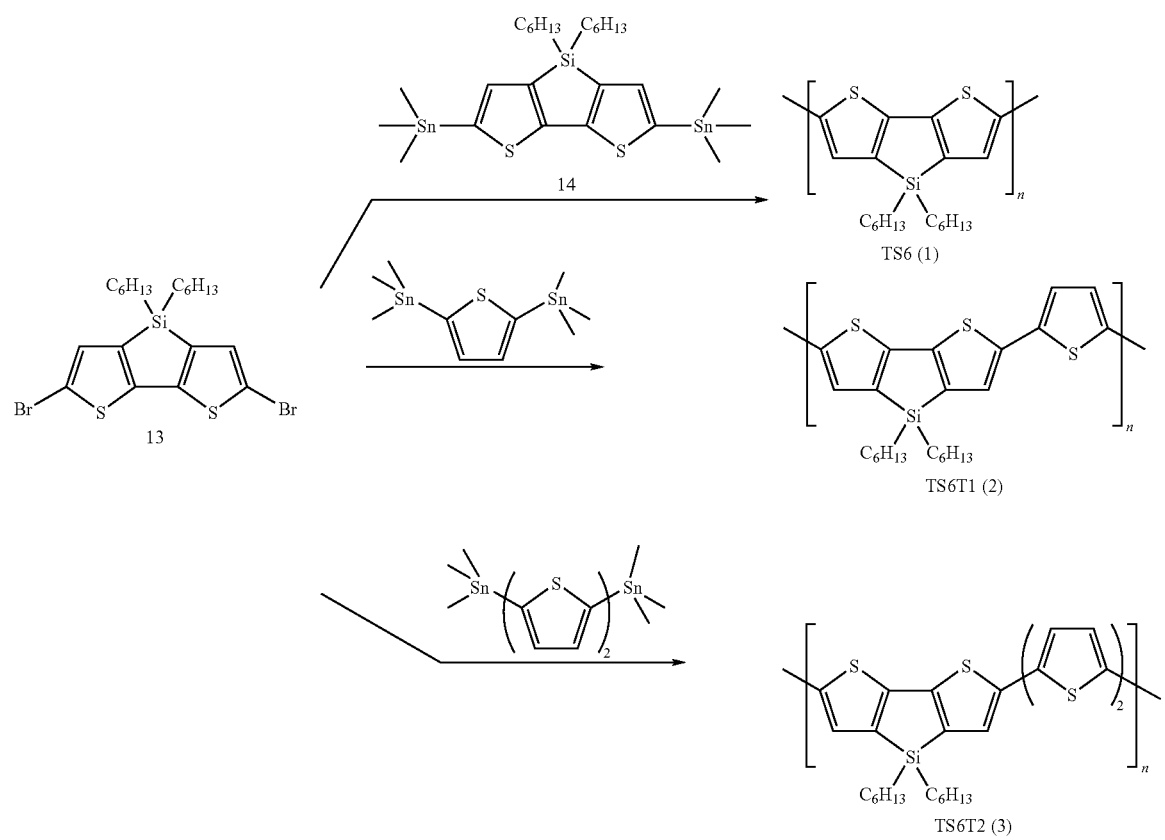

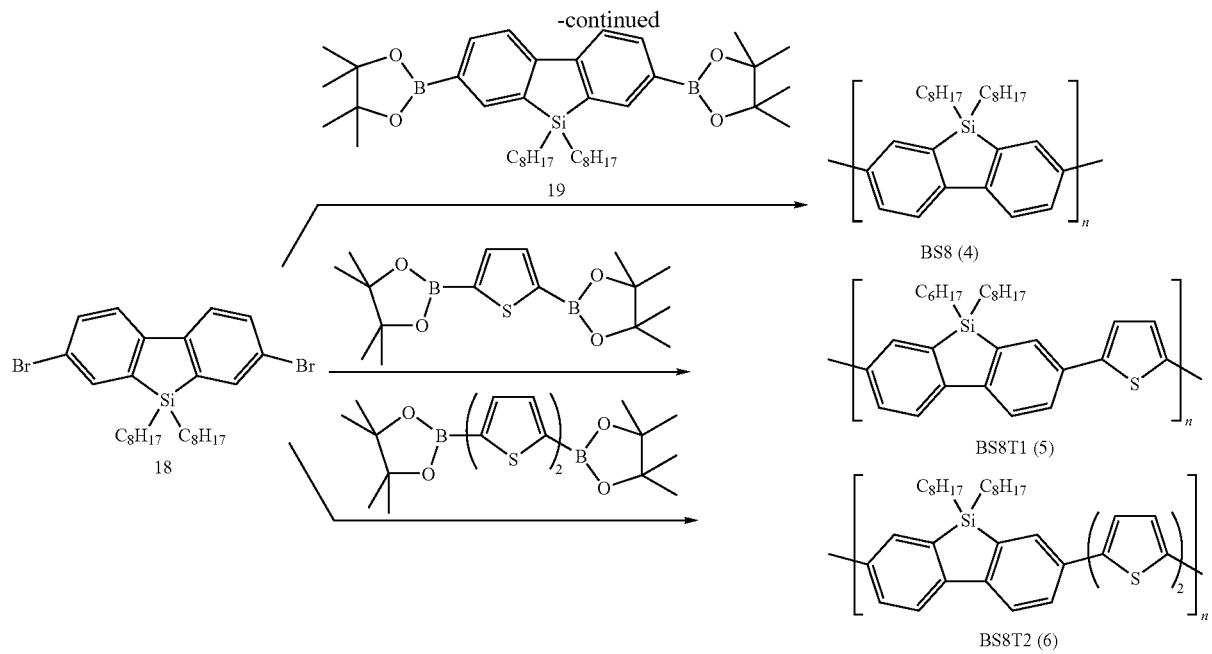

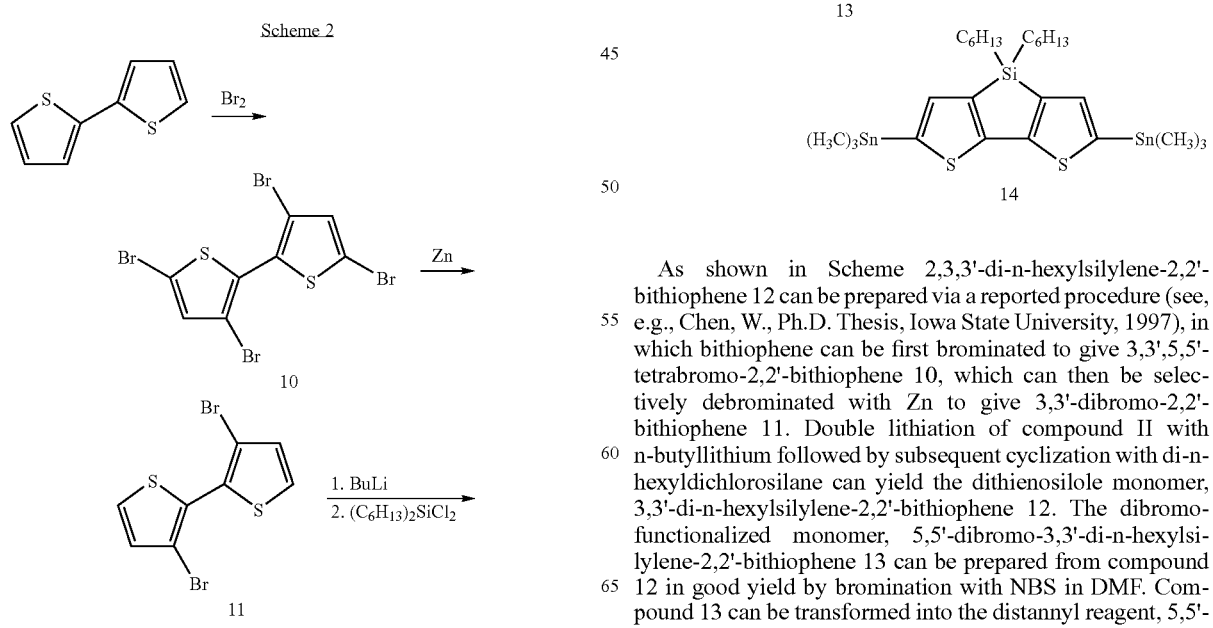

As shown in Scheme 1, dithienosilole-based polymers 1-3 can be synthesized via the Stille polycondensation reaction between compounds 13 and 14, between compound 13 and 2,5-bis(trimethylstannyl)thiophene, and between compound 13 and 2,5'-bis(trimethylstannyl)bithiophene, respectively, in excellent yields. Dibenzosilole-based polymers 4-6 can be prepared via the Suzuki polycondensation reaction between compounds 18 and 19, between compound 18 and 2,5-bis(4,4,5,5-tetramethyl-1,3,2-dioxaborolan-2-yl)thiophene, and between compound 18 and 2,5'-bis(4,4,5,5-tetramethyl-1,3,2-dioxaborolan-2-yl)bithiophene in moderate to good yields.

The building blocks (e.g., monomeric forms) of polymers of Formula I' (and also Formula II' and Formula III') can be prepared according to Scheme 2 and Scheme 3 below.

As shown in Scheme 2, 3,3'-di-n-hexylsilylene-2,2'-bithiophene 12 can be prepared via a reported procedure (see, e.g., Chen, W., Ph.D. Thesis, Iowa State University, 1997), in which bithiophene can be first brominated to give 3,3',5,5'-tetrabromo-2,2'-bithiophene 10, which can then be selectively debrominated with Zn to give 3,3'-dibromo-2,2'-bithiophene 11. Double lithiation of compound II with n-butyllithium followed by subsequent cyclization with di-n-hexyldichlorosilane can yield the dithienosilole monomer, 3,3'-di-n-hexylsilylene-2,2'-bithiophene 12. The dibromo-functionalized monomer, 5,5'-dibromo-3,3'-di-n-hexylsilylene-2,2'-bithiophene 13 can be prepared from compound 12 in good yield by bromination with NBS in DMF. Compound 13 can be transformed into the distannyl reagent, 5,5'-bis(trimethyltin)-3,3'-dihexyldithienosilole 14 by treatment of compound 13 with n-BuLi (e.g., at a reduced temperature such as −78° C. and in a solvent such as THF) followed by treatment with trimethyltin chloride.

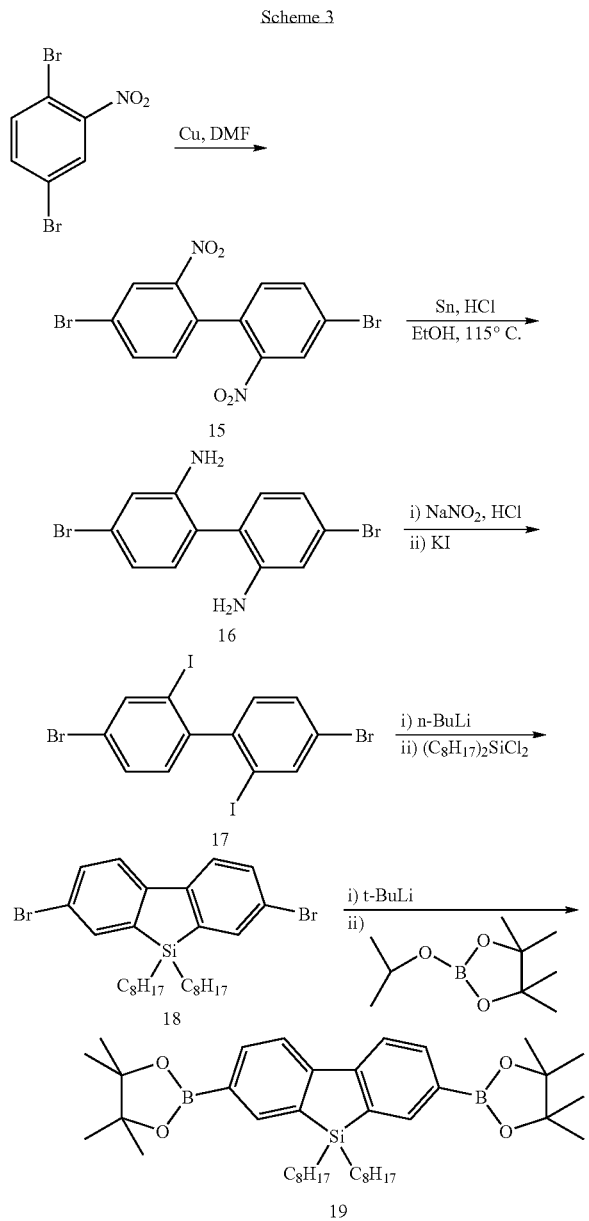

As shown in Scheme 3, 2,7-dibromo-9,9-dioctyldibenzosilole 18 can be prepared by a known procedure starting from the coupling of 1,4-dibromo-2-nitrobenzene via the Ullmann protocol. See, e.g., Chan, K. L. et al., *J. Am. Chem. Soc.*, 127: 7662-7663 (2005). The Ullmann coupling product, 4,4'-dibromo-2,2'-dinitrobiphenyl 15 can be reduced to the corresponding diamine, 4,4'-dibromobiphenyl-2,2'-diamine 16, and Sandmeyer reaction of compound 16 with sodium nitrite in concentrated HCl, followed by the addition of a 10-fold excess of concentrated KI solution, can afford the biphenyl, 4,4'-dibromo-2,2'-diiodobiphenyl 17. Conventional Sandmeyer reactions with stoichiometric amounts of KI also can result in compound 17. Selective trans-lithiation of the 2,2'-iodo-substituents of compound 17 with 4 equivalents of n-BuLi (e.g., at a reduced temperature such as −78° C. and in a solvent such as THF) followed by subsequent cyclization with di-n-octyldichlorosilane can afford the dibenzosilole monomer, 2,7-dibromo-9,9-dioctyldibenzosilole 18 in good yield. Compound 18 can be converted to the pinacolato ester, 2,7-bis(4,4,5,5-tetramethyl-1,3,2-dioxaborolan-2-yl)-9,9-dioctyldibenzosilole 19 by treatment with t-BuLi (e.g., at a reduced temperature such as −78° C. and in a solvent such as THF), followed by treatment with 4,4,5,5-tetramethyl-[1,3,2]dioxaborolane, for use as the co-monomer 19 in the homopolymerization with monomer 18.

Without limiting the scope of the present teachings in any way and only for the purpose of illustration, certain embodiments of the polymers of the present teachings can be characterized by one or more of the physical properties described hereinbelow. Further, for the purpose of comparison, two fluorene-containing thiophene copolymers may be discussed along with the polymers of the present teachings. The structures of the two fluorene-containing thiophene copolymers are as follows:

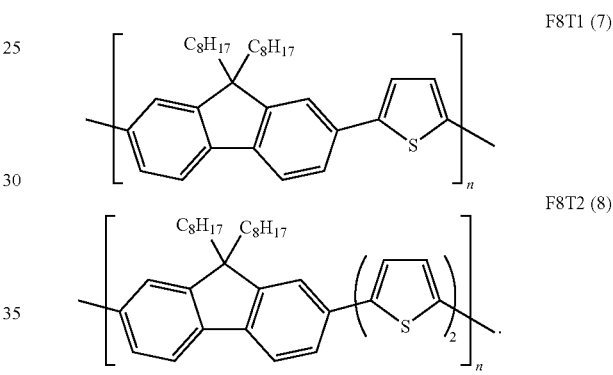

The molecular weights of the polymers of the present teachings can be determined using gel permeation chromatography (GPC). In an embodiment of a polymer of Formula I' where Z is S, specifically, polymer 1, its molecular weight ($M_w$) was determined by high-temperature GPC to be 26 kD. Its polydispersity index (PDI) was determined to be 2.9. Similarly, for an embodiment of polymer 2, $M_w$ was determined to be 30 kD and its PDI was determined to be 2.9. For an embodiment of polymer 3, $M_w$ was determined to be 41 kD and its PDI was determined to be 3.0. It was observed that these embodiments are freely soluble in common non-protic organic solvents such as THF, toluene, xylenes, chloroform, methylene chloride, chlorobenzene, o-dichlorobenzene (DCB), and 1,2,4-trichlorobenzene (TCB).

In an embodiment of a polymer of Formula I' where Z is CH=CH, specifically, polymer 4, its GPC-derived molecular weight was determined to be 32 kD and its PDI was determined to be 3.4. Similarly, for an embodiment of polymer 5, $M_w$ was determined to be 112 kD and its PDI was determined to be 3.1. For an embodiment of polymer 6, $M_w$ was determined to be 127 kD and its PDI was determined to be 3.7. It was observed that the particular embodiment of polymer 4 described is very soluble in common non-protic organic solvents. For the particular embodiments of polymers 5 and 6 described, each of which have a relatively high molecular weight, these embodiments are mainly soluble in chlorinated aromatic solvents such as warm chlorobenzene, DCB, and TCB.

The thermal stability of the polymers disclosed herein can be determined by thermogravimetric analysis (TGA). For example, using a heating ramp rate of 10° C./min under $N_2$, and a 5% mass loss defined as the threshold, the TGA onset temperature for an embodiment of polymer 1 was observed to be 250° C., while for certain embodiments of the polymers 2-8, their onset temperatures were observed to be above 400° C., which can be indicative of good thermal stability (FIG. 1).

The thermal properties of the polymers of the present teachings can also be examined by differential scanning calorimetry (DSC). For example, using a scanning speed of 10° C./min under $N_2$, it was observed that an embodiment of polymer 2 exhibited a single endotherm around 250° C. on heating and cooling (FIG. 2), while an embodiment of polymer 3 exhibited a broad endotherm near 300° C. (not shown). In these and other embodiments for both polymers, the endotherms and the exotherms can be reversible over many cycles.

Figure 3:
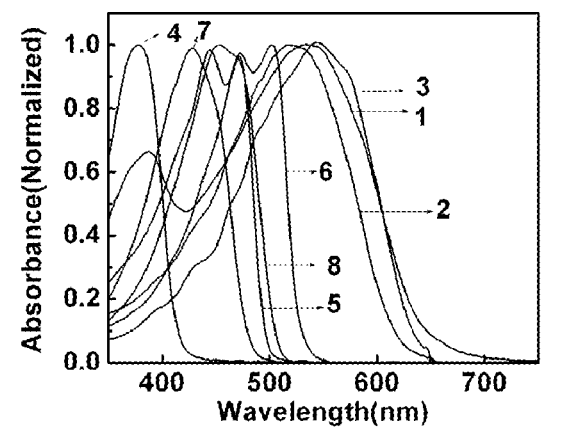
FIG. 3 shows the UV-Vis absorption spectra of certain embodiments of the polymers of the present teachings (i.e., polymers 1-8) in THF solution (A), and as thin films (B), as well as the photoluminescence (PL) spectra of the same polymers in THF solution (C).
Figure 3:
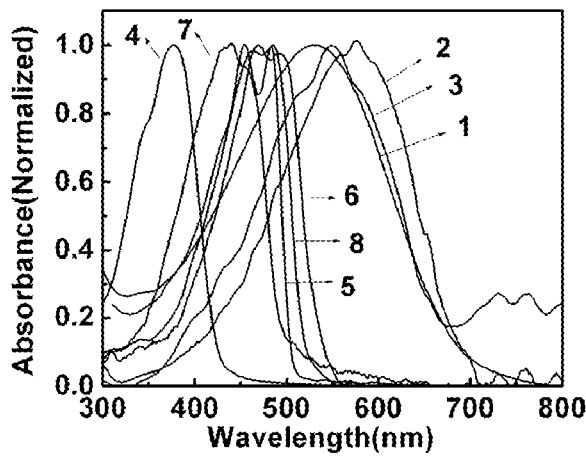
Figure 3:
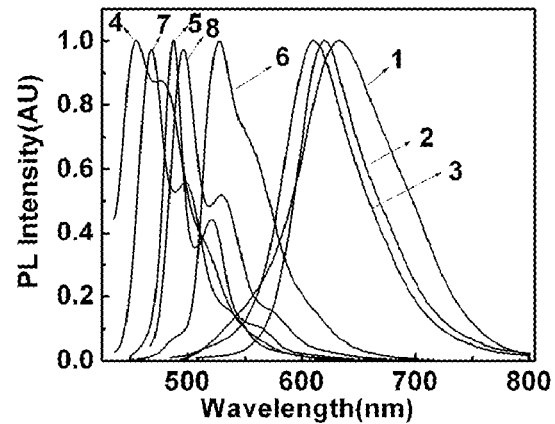

FIGS. 3A-B, an embodiment of polymer 1 in THF exhibited a single absorption maximum at 533 nm, while as solution-cast thin films on silicon wafers, the same embodiment showed a similar absorption maximum at 535 nm. In some embodiments, the absorption maxima for polymers 2 and 3 were located at 521 nm and 544 nm, respectively, in THF. Certain embodiments of polymers 2 and 3 were solution-cast on silicon wafers and the resulting thin films formed thereon were observed to be smooth and shiny. In solid state (i.e., as thin films), these embodiments exhibited red-shifted absorption maxima at 574 nm for the polymer 2 and at 545 nm for polymer 3. Without wishing to be bound to any particular theory, the red-shift in the absorption maximum of polymer 2 (approximately 50 nm) from solution to the thin film suggests a high-degree molecular organization in the thin film phase. For the embodiments described above, polymers 1 and 3 seem to exhibit little difference in optical properties between solution-phase and thin-film state.

TABLE 1

| Polymer | $T_m, T_c^a$ (° C.) | $T_d^c$ (° C.) | $\lambda_{sol}(E_g)$ (nm, eV) | $\lambda_{film}(E_g)$ (nm, eV) | $\lambda_{em}$ (nm) | $\mu_h$ (cm$^2$/V-s) | $I_{on}:I_{off}$ |
|---|---|---|---|---|---|---|---|
| TS6 (1) | —$^b$ | 285 | 533 (1.9) | 535 (1.8) | 601 | —$^b$ | —$^b$ |
| TS6T1 (2) | 257, 230 | 480 | 521 (2.0) | 574 (1.8) | 611 | 0.05 | 1 × 10$^5$ |
| TS6T2 (3) | 300, —$^b$ | 445 | 544 (1.9) | 545 (1.9) | 620 | 0.08 | 5 × 10$^4$ |
| BS8 (4) | —$^b$ | 410 | 377 (3.0) | 401 (2.9) | 455 | —$^b$ | —$^b$ |
| BS8T1 (5) | 253, —$^b$ | 420 | 471 (2.5) | 484 (2.5) | 488 | 6 × 10$^{-5}$ | 3 × 10$^4$ |
| BS8T2 (6) | 340, 295 | 430 | 503 (2.3) | 493 (2.3) | 528 | 0.006 | 4 × 10$^6$ |
| F8T1 (7)$^d$ | 267, —$^b$ | 415 | 427 (2.6) | 440 (2.5) | 469 | 9 × 10$^{-5}$ | 2 × 10$^5$ |
| F8T2 (8)$^d$ | 259 and 277, 196 | 425 | 456 (2.4) | 460 (2.4) | 496 | 0.006 | 2 × 10$^5$ |

$^a$Melting temperature ($T_m$) and crystallization temperature ($T_c$) determined by DSC.
$^b$Below the detection limit.
$^c$Onset decomposition temperature measured by TGA under nitrogen.
$^d$Polymer 7 and 8 are used as references.

Figure 2:
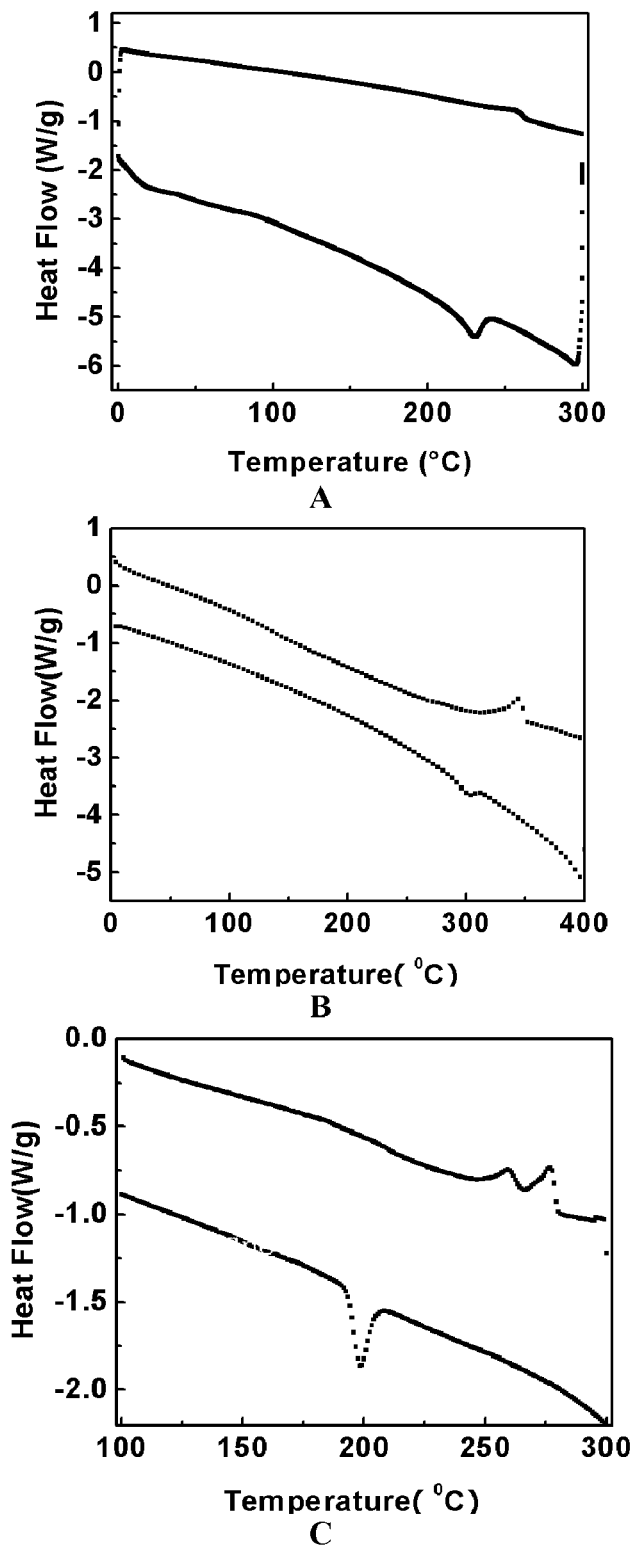
FIG. 2 shows the differential scanning calorimetry (DSC) curves of certain embodiments of the polymers of the present teachings (i.e., polymers 2 (A), 6 (B), and 8 (C)).

It was further observed that an embodiment of polymer 5 exhibited a broad transition at 253° C. in the heating cycle, but an exotherm was not observed in the cooling cycle. Similar observations were made with regard to an embodiment of polymer 7, which exhibited a single endotherm around 267° C. For an embodiment of polymer 6, an endothermic melting feature at 340° C. was observed in the heating cycle which can be attributed to the melting of the polymeric backbone (FIG. 2). Upon cooling, an exothermic recrystallization peak was seen at 295° C. Both the melting and recrystallization peaks were completely reversible over four cycles.

In some embodiments, polymers containing thiophene units can have higher melting temperatures compared to those that do not contain thiophene units (see TGA curves of polymers 1 and 2, and polymers 4 and 5 in FIG. 1). Meanwhile, dibenzosilole- and dithienosilole-based polymers that contain the same number of thiophene units can have comparable melting temperatures. For example, the melting temperatures ($T_m$) of certain embodiments of polymers 2 and 5, and certain embodiments of polymers 3 and 6 were observed to be comparable. In some embodiments, silicon substitution was observed to have resulted in a lowering of $T_m$. For example, for an embodiment of polymer 5, a negative difference of 15° C. was observed compared to an otherwise similar embodiment of polymer 7. In other embodiments, silicon substitution was observed to have resulted in an increase of $T_m$ and $T_c$. For example, for an embodiment of polymer 6, a positive difference of 60-100° C. was observed compared to an otherwise similar embodiment of polymer 8.

Solution and thin-film UV-Vis absorption spectra for certain embodiments of the polymers of Formula I are shown in FIGS. 3A-B and data are collected in Table 1. Referring to With continued reference to FIGS. 3A-B, the UV-Vis absorption spectra of some embodiments of dibenzosilole-based polymers 4-6 showed absorption maxima that are blue-shifted compared to those of dithienosilole-based polymers 1-3. For example, certain embodiments of polymers 5 and 6 exhibited two absorption maxima located at 444 nm and 471 nm, and at 473 nm and 503 nm, respectively. Without wishing to be bound to any particular theory, it is believed that these transitions can correspond to the largely local transitions of the constituent dibenzosilole and mono/bithiophene copolymer building blocks. In some embodiments, the absorption maximum for the homopolymer 4 was observed to occur at 377 nm, which is believed to correspond to the highest energy $\pi$-$\pi$* transition in the silole-based polymer series. In thin-film state, the absorption maxima of certain embodiments of polymers 4-6 were located at 401 nm, 484 nm and 493 nm, respectively. In comparison, fluorene-based copolymers exhibited maxima at 427 nm in solution and 440 nm as thin films for an embodiment of polymer 7, and 456 nm in solution with a strong shoulder at 502 nm and 460 nm as thin film for an embodiment of polymer 8. In some embodiments, dibenzosilole-based copolymers 5 and 6 showed significant bathochromic shifts of ca. 40-50 nm compared to the fluorene-based polymers 7 and 8. For these embodiments, annealing seems to have had little impact on the film absorption maxima.

The solution photoluminescence (PL) emission spectra of certain embodiments of the polymers disclosed herein are shown in FIG. 3C. Corresponding data can be found in Table 1. Consistent with their absorption spectra, dithienosilole-based polymers 1-3 generally seemed to show emissions at longer wavelengths (about 100-150 nm red-shifted) compared to the dibenzosilole-based polymers 4-6. In particular, for the embodiments studied, the dithienosilole-based polymers emitted red light with emission maxima at 601 nm, 611 nm, and 620 nm for polymers 1, 2, and 3, respectively. In comparison, an embodiment of the homopolymer 4 emitted blue light with a maximum at 455 nm, while certain embodiments of the copolymers 5 and 6 showed green-orange emissions with maxima at 488 nm and 528 nm, respectively, which are believed to correspond to the 0-0 transition in dilute solutions. The 0-1 and 0-2 transitions in the PL emission spectra can be observed at 477 nm and 512 nm for the polymer 4 and at 521 nm and 561 nm for the polymer 5. The embodiment of polymer 6 described above exhibited a 0-1 transition at 555 nm.

With continued reference to FIG. 3C, fluorene-based polymers 7 and 8 showed hypsochromic shifts versus the dibenzosilole-based polymers with the emission maxima at 469 nm and 496 nm, respectively. For the embodiments studied, polymers 5 and 6 showed emissions which are 20-30 nm redshifted compared to those of fluorene-based polymers 7 and 8. In particular, polymers 5 and 6 exhibited modest Stokes shifts of 20 nm between the absorption and emission maxima which are smaller than those of polymers 7 and 8 (~40 nm), however larger Stokes shifts of 70-90 nm can be observed for the embodiments described above with respect to homopolymer 4 and dithienosilole-based polymers 1-3.

Figure 4:
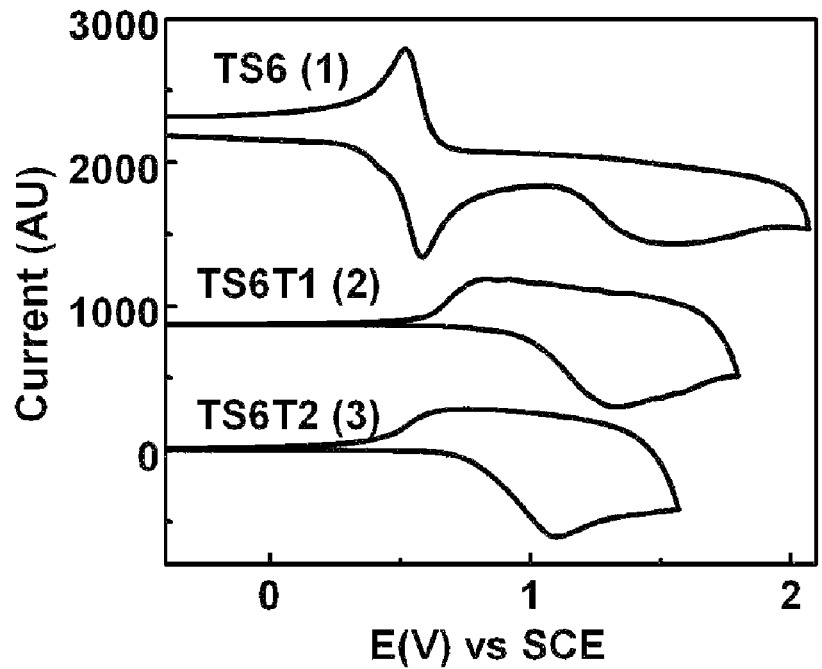
FIG. 4 shows cyclic voltammograms of certain embodiments of the polymers of the present teachings (i.e., polymers 1-8) as thin films in a 0.1 M $Bu_4NPF_6$ solution in acetonitrile at a scan rate of 100 mV/s.
Figure 4:
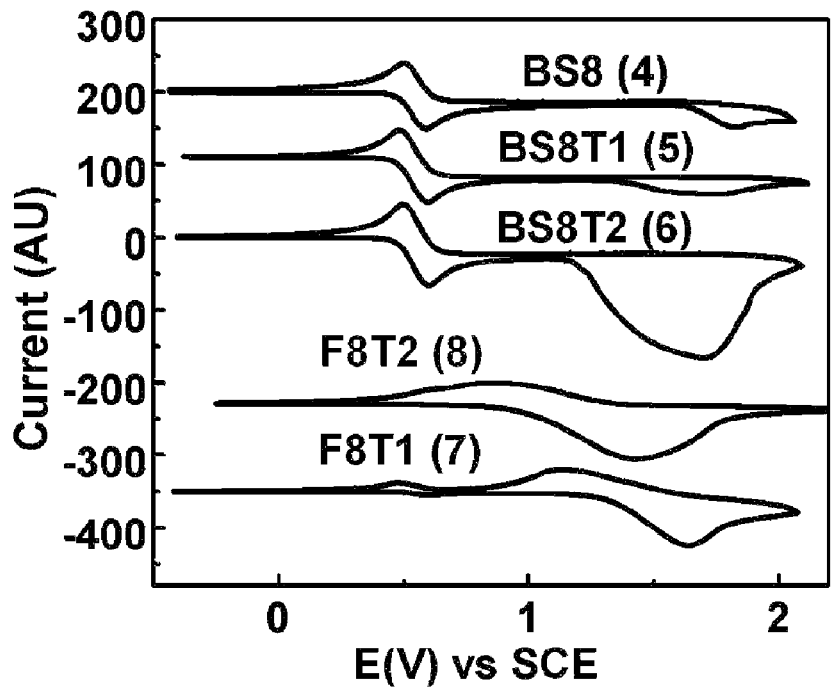

Cyclic voltammetry (CV) can be used to investigate the ionization potentials, electron affinities, and estimates of the polymer electronic states (HOMO and LUMO levels) of the polymers of the present teachings. Cyclic voltammograms of certain embodiments of the present polymers as thin films are shown in FIG. 4, with corresponding electrochemical data summarized in Table 2 below.

TABLE 2

| Polymer | $E_{ox}^{onset}$ (V)[a] | $E_{ox}^{f}$ (V)[b] | HOMO (eV) | $E_g$ (eV)[c] | LUMO (eV) |
| --- | --- | --- | --- | --- | --- |
| TS6 (1) | 1.2 | 1.5 | −5.6 | 1.8 | −3.8 |
| TS6T1 (2) | 0.9 | 1.3 | −5.3 | 1.8 | −3.5 |
| TS6T2 (3) | 0.8 | 1.1 | −5.2 | 1.9 | −3.3 |
| BS8 (4) | 1.6 | 1.8 | −6.0 | 2.9 | −3.1 |
| BS8T1 (5) | 1.4 | 1.8 | −5.8 | 2.5 | −3.3 |
| BS8T2 (6) | 1.2 | 1.7 | −5.6 | 2.3 | −3.3 |
| F8T1 (7)[d] | 1.3 | 1.6 | −5.7 | 2.5 | −3.2 |
| F8T2 (8)[d] | 1.0 | 1.4 | −5.4 | 2.4 | −3.0 |

[a]Onset voltage for oxidation.
[b]Formal oxidation voltage.
[c]Optical band gap estimated from the low energy band edge in the UV-Vis spectroscopy.
[d]Polymer 7 and 8 are used as references.

In some embodiments, it was observed that the dithienosilole-based polymers 1, 2, and 3 exhibited oxidation onset potentials of 1.2 V, 0.9 V, and 0.8 V, respectively, (versus a saturated calomel electrode (SCE)), with formal oxidation potentials in the range of 1.1-1.5 V (versus SCE). For certain embodiments of the dibenzosilole-based polymers, the onset oxidation potentials for the were determined to be 1.6 V, 1.4 V, and 1.2 V (versus SCE) for polymers 4, 5, and 6, respectively, which are 0.4-0.5 V greater than for the dithienosilole-based polymers. Without wishing to be bound to any particular theory, it is believed that polymers 4, 5, and 6 may have higher stabilities against oxidative doping. The formal oxidation potentials for 4-6 were determined to be in the range of 1.7-1.8 V (versus SCE). All of the studied embodiments exhibited no obvious reduction peaks, suggesting that they can be suitable for p-type charge conduction. However, without wishing to be bound to any particular theory, it is believed that the use of appropriate gate insulators and/or copolymerization with other suitable monomers can yield n-channel activity as well.

Figure 5:
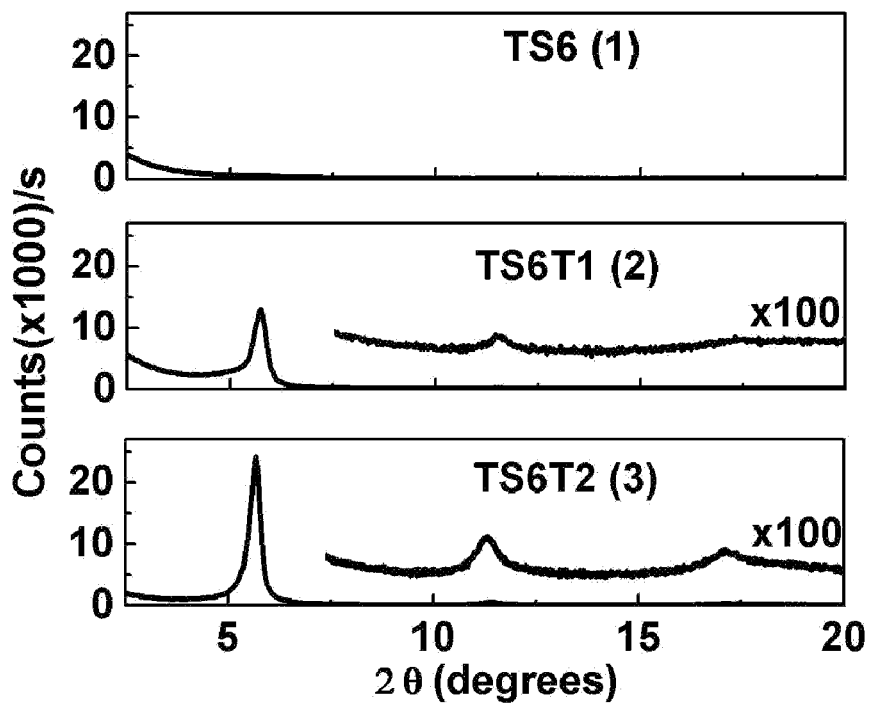
FIG. 5 shows X-ray diffraction (XRD) scans of drop-cast films of certain embodiments of the polymers of the present teachings (i.e., polymers 1-6 on silicon substrates.
Figure 5:
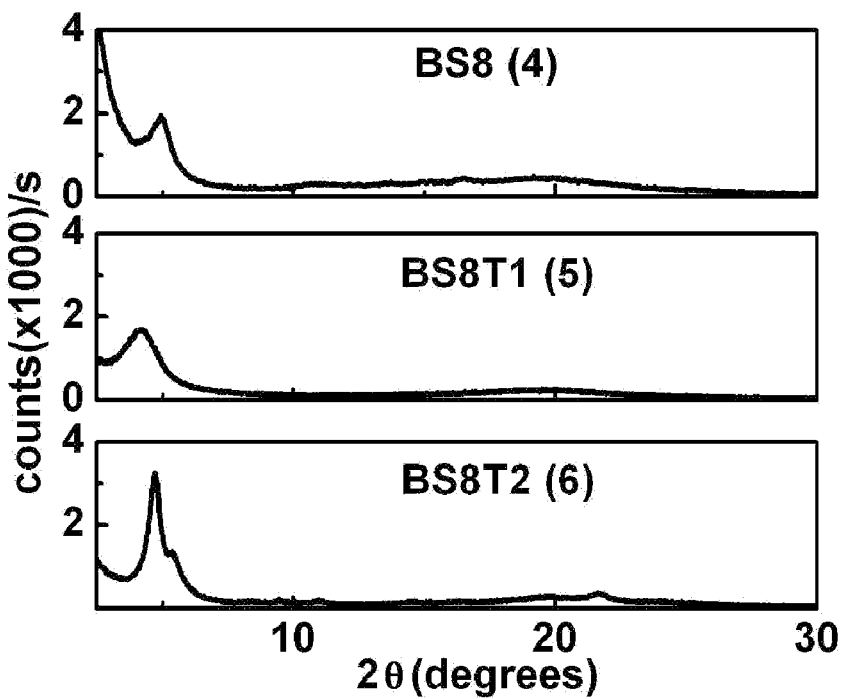

The structural order of polymers of the present teachings can be determined by 0-2θ X-ray diffraction (XRD) scans. Referring to FIG. 5, certain embodiments of the polymers disclosed herein, when prepared as thick drop-cast films (about 250-300 nm) from 0.5 wt % solutions in THF or 1,2,4-trichlorobenzene and annealed at 250° C. under nitrogen for 30 minutes, appeared to be crystalline. For example, certain embodiments of polymers 2 and 3 exhibited highly crystalline patterns with distinct primary diffractions at 2θ=5.68° and 5.74°, which can correspond to d-spacings of 15.54 and 15.38 Å, respectively. Without wishing to be bound to any particular theory, the absence of π-π stacking diffractions in the copolymers 2 and 3 may suggest that the polymer chains preferentially adopt an "edge-on" orientation relative to the substrate with layered structures. In comparison, certain embodiments of dibenzosilole-based polymers 4-6 showed broader and weaker diffractions features compared to polymers 2 and 3. In particular, the homopolymer 4 exhibited a single major reflection at 2θ=4.97°, which can correspond to a d-spacing of 17.76 Å, while polymers 5 and 6 both exhibited a single major reflection at 2θ=4.22° and 4.72°, which can correspond to an inter-chain d-spacing of 20.91 and 18.70 Å. Further, dibenzosilole-based polymers exhibited broad peaks at ca. 2θ=20° for polymers 4 and 5, and at 21.95° for polymer 6, which can correspond to π-π stacking distances of 4.0-4.4 Å. The dithienosilole homopolymer 1 appeared to be amorphous (at least with respect to the embodiment studied).

Polymers including repeating units of Formula I, Formula II, and/or Formula III such as, but not limited to, polymers of Formula I', Formula II' and III', can be used to prepare semiconductor materials (e.g., compositions and composites), which in turn can be used to fabricate various organic electronic articles, structures and devices. In some embodiments, semiconductor materials incorporating one or more polymers of the present teachings can be used as p-type semiconductor materials. In other embodiments, semiconductor materials incorporating one or more polymers of the present teachings can exhibit n-type semiconducting activity. Among other applications, these semiconductor materials can be used to build complementary circuits with an n-type (or p-type) semiconductor that is either inorganic or organic.

Accordingly, the present teachings further provide articles of manufacture, for example, composites, that include a semiconductor material of the present teachings and a substrate component and/or a dielectric component. The substrate component can be selected from, but is not limited to, doped silicon, an indium tin oxide (ITO), ITO-coated glass, ITO-coated polyimide or other plastics, aluminum or other metals alone or coated on a polymer or other substrate, a doped polythiophene, and the like. The composite can include a dielectric component. The dielectric component can be selected from various compounds or materials otherwise known or found useful in the art. The composite can include one or more electrical contacts. Such electrical contacts can be made of a metal (e.g., gold) and can function as source, drain, or gate contacts. One or more of the composites described above can be embodied within various organic electronic devices such as organic thin film transistors (OTFTs), as well as capacitors, complementary circuits (e.g., inverter circuits), and the like.

As certain embodiments of the polymers disclosed herein can be soluble in common solvents, the polymers of the present teachings can offer processing advantages when used to fabricate electrical devices such as thin film semiconductors, field-effect devices, organic light emitting diodes (OLEDs), organic photovoltaics, photodetectors, capacitors, and sensors.

The present teachings, therefore, further provide methods of preparing a semiconductor material. The methods can include preparing a precursor composition that includes a polymer disclosed herein in one or more organic solvents, depositing the precursor composition on a substrate to provide a semiconductor material precursor, and heating the semiconductor precursor to provide a semiconductor material (e.g., a thin film semiconductor) that includes a polymer disclosed herein. In some embodiments, the depositing step can be carried out by printing, including inkjet printing and various contact printing techniques (e.g., screen-printing, gravure, offset, pad, and microcontact printing). In certain embodiments, the depositing step can be carried out by spin coating, drop-casting, dip coating, blade coating, or spraying.

Another aspect of the present teachings relates to methods for fabricating organic field effect transistors that incorporate a semiconductor material of the present teachings. The semiconductor materials of the present teachings can be used to fabricate various types of organic field effect transistors including, but not limited to, top-gate top-contact capacitor structures, top-gate bottom-contact capacitor structures, bottom-gate top-contact capacitor structures, and bottom-gate bottom-contact capacitor structures.

Various articles of manufacture, structures, and devices that make use of the organic semiconductor polymers disclosed herein are also within the scope of the present teachings. Examples of such articles include, but are not limited to, organic field effect transistors (e.g., thin film transistors), organic analogs to, and hybrids with, complementary metal oxide semiconductors (CMOS) circuitry, complementary inverters, D flip-flops, and ring oscillators and so forth.

In some embodiments, OTFT devices can be fabricated with the present polymers on low resistivity n-type silicon wafers, using thermally grown $SiO_2$ (300 nm) or HMDS-passivated $SiO_2$ as the dielectric, in top contact geometries. In certain embodiments, all device fabrication procedures can be carried out in air. In particular embodiments, the active semiconducting layer which incorporates at least a polymer of the present teachings can be applied by spin-coating 5 mg/mL solutions in various solvents for 3 minutes. For top contact devices, gold contacts can be patterned on top of the films using shadow masks, giving channel lengths from 25 to 100 μm and widths from 500 to 2000 μm.

More specifically, solutions of polymers 2 and 3 in 1,2,4-trichlorobenzene (TCB, b.p. 214° C.), 1,4-dichlorobenzene (DCB, b.p. 180-181° C.), chlorobenzene (CB, b.p. 131° C.), p-xylene (b.p. 138° C.), and o-xylene (b.p. 143-145° C.) can be spin-coated onto silicon substrates with $SiO_2$ as the gate dielectric. The film thicknesses can be between 50-70 nm, as determined by profilometry. In some embodiments, the solutions can be heated to 80° C. to prevent gelation prior to spin-coating. In some embodiments, the resulting devices can be annealed at 130° C. under nitrogen for 30 minutes before measurements. It was observed, for example, that THF solutions of polymers 2 and 3 formed smooth thin films on HMDS-treated silicon substrates.

Figure 6:
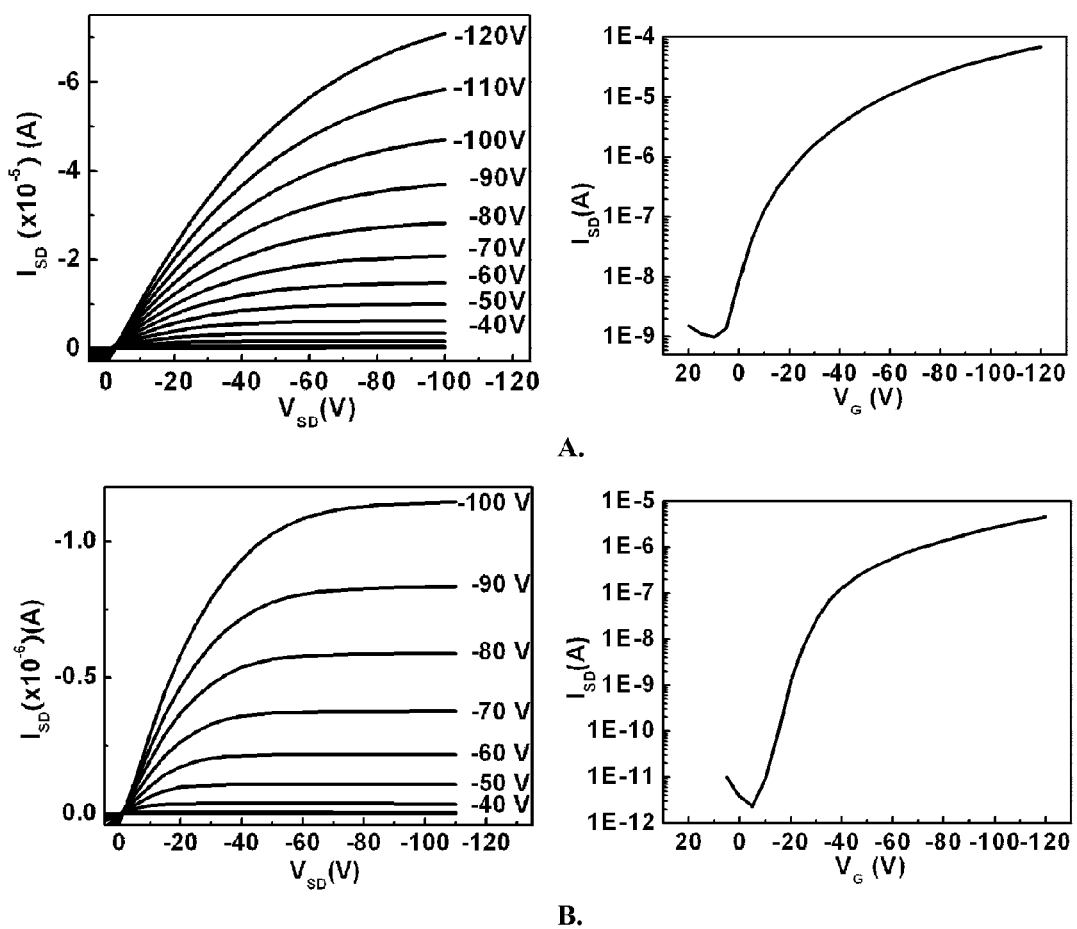
FIG. 6 shows OFET plots of devices fabricated with certain embodiments of the polymers of the present teachings (i.e., polymers 3 and 6): transfer plot of polymer 3 at $V_{SD}=-100$ V and output plot of polymer 3 (A) and transfer plot of polymer 6 at $V_{SD}=-100$ V and output plot of polymer 6 (B).

Without limiting the scope of the present teachings in any way and only for the purpose of illustration, OFETs were fabricated with certain embodiments of polymers 2, 3, 5, and 6 using the procedures described above. Illustrative transfer plots ($V_{SD}=-100V$) and output plots of devices fabricated with polymers 3 and 6 are presented in FIGS. 6A-B.

For the embodiments studied, devices of polymer 2 spin-coated from 1,2-dichlorobenzene exhibited the highest saturated hole mobility of 0.002 $cm^2$/Vs and $I_{on}/I_{off} \sim 10^2$-$10^3$ for a channel length of 100 μm, while hole mobilities are comparable for devices having films spin-coated from other solvents. Thin films of polymer 3 spin-coated from all solvents exhibited very similar saturated hole mobilities of $\sim 10^{-4}$ $cm^2$/Vs. In one example, p-xylene and o-xylene were noted to have increased the $I_{on}/I_{off}$ ratios one order of magnitude for devices fabricated with polymer 3. Devices fabricated from polymers 5 and 6 on untreated $SiO_2$ substrates showed hole mobilities one or two orders of magnitude lower than devices fabricated with polymers 2 and 3. In particular, among the embodiments studied, devices fabricated with polymer 5 exhibited the highest mobility of $5 \times 10^{-6}$ $cm^2$/Vs with $I_{on}/I_{off}=1 \times 10^{-4}$ for thin films spin-coated from TCB solution. Among the embodiments studied, devices fabricated with polymer 6 provided the best performance when spin-coated from TCB solutions, with a mobility of $1 \times 10^{-4}$ $cm^2$ V-s and $I_{on}/I_{off}=1 \times 10^5$.

When spin-coated on HMDS-passivated silicon substrates, devices of 2, 3, 5, and 6 seemed to exhibit much enhanced TFT response. In particular, high-quality thin films (about 25-30 nm in thickness and having an RMS roughness of about 0.2-0.3 nm as indicated by AFM) obtained from hot THF solutions of polymers 2 and 3 and annealed at 150° C. under nitrogen, exhibited mobilities of 0.01 $cm^2$/Vs and 0.007 $cm^2$/Vs, respectively, and $I_{on}/I_{off}=1 \times 10^4$ for both. The performance of similar devices fabricated with films of polymers 5 and 6 also improved using HMDS-passivated silicon substrates.

In some embodiments, annealing can improve the TFT device performance (e.g., in terms of mobility and in $I_{on}/I_{off}$ ratio) for devices fabricated with the polymers of the present teachings. For example, devices can be annealed under a nitrogen atmosphere at 100° C., 150° C., 200° C., 250° C., and 300° C. for 30 minutes, followed by cooling to room temperature by either quenching in air or by slow cooling under nitrogen. In some embodiments, quenched devices can have mobilities superior to those of slow-cooled devices.

Figure 7:
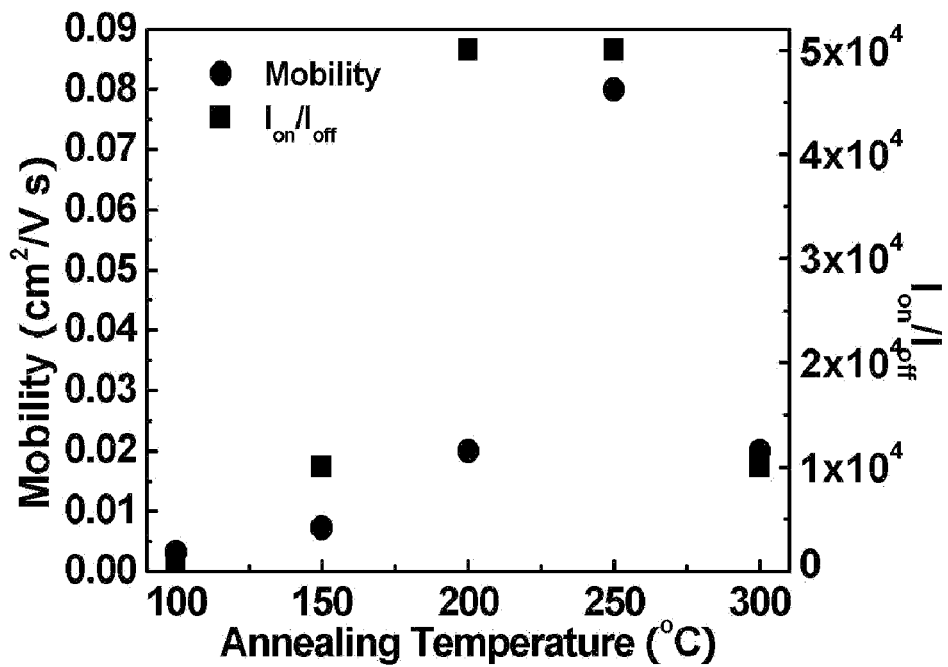
FIG. 7 plots the field effect mobility and $I_{on}/I_{off}$ ratio in OFETs of certain embodiments of the polymers of the present teachings (i.e., polymer 3 (A) and polymer 6 (B)) against annealing temperature.
Figure 7:
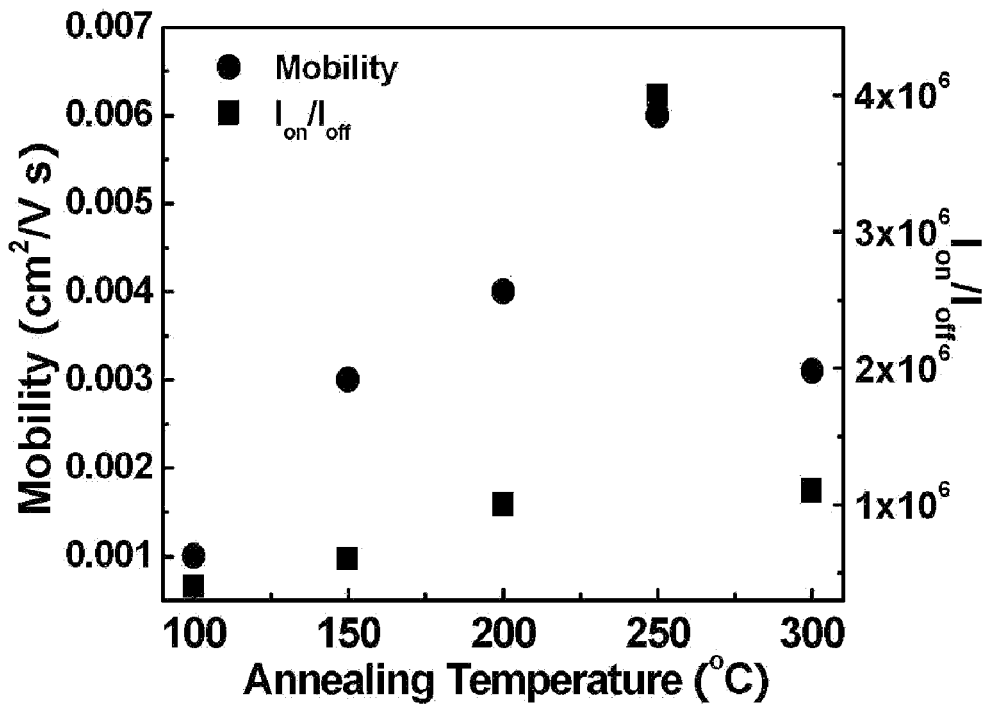

The evolution of mobilities and $I_{on}/I_{off}$ ratios of devices with annealing temperature was studied using devices fabricated with embodiments of polymers 2, 3, 5, and 6 and reference polymers 7 and 8. Among the embodiments studied, the device performance seemed to maximize at an annealing temperature of 250° C. For example, for devices annealed at 250° C. and referring to FIG. 7, the highest mobilities of devices fabricated with polymers 2 (not shown) and 3 were observed to be 0.05 and 0.08 $cm^2$/V-s, with $I_{on}/I_{off}$ ratios of $1 \times 10^5$ and $5 \times 10^4$, respectively. For polymers 5 (not shown) and 6, the maximum mobilities were observed to be $6 \times 10^{-5}$ and 0.006 $cm^2$/V-s with $I_{on}/I_{off}$ ratios of $5 \times 10^4$ and $4 \times 10^6$, respectively. In some embodiments, low threshold voltages (0-10 V) were observed for devices fabricated with polymers 2, 3, and 6. For polymer 5, the threshold voltages were observed to be slightly higher (about −10 V to −30 V). Without wishing to be bound to any particular theory, it is believed that this can be due to the mismatch between the work function of the gold electrode (−5.1 V) and their HOMO levels. In some embodiments, higher temperatures can have detrimental effects on polymers of the present teachings, even though the melting temperatures of polymers 3 and 6 are around 300° C.

Figure 8:
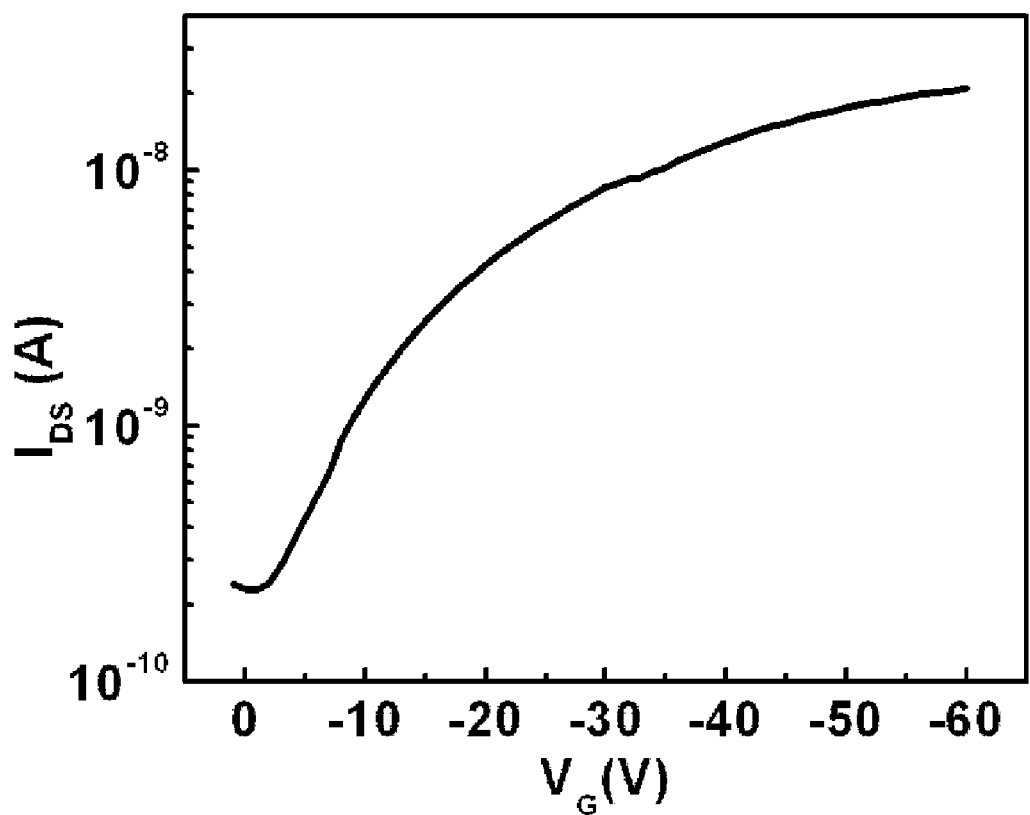
FIG. 8 is an OFET transfer plot of a graveur-printed device fabricated with an embodiment of the polymer of the present teachings (i.e., polymer 6) at $V_{SD}=-40$ V.

In some embodiments, printed OFETs can be fabricated with polymer thin films deposited by gravure printing from highly viscous solutions. For example, printed OFETs were fabricated with an embodiment of polymer 6 (0.5% (w/v) in TCB) on a PET-Al-CPB substrate in which the dielectric layer was also printed. After printing and before Au contact deposition, the printed films were annealed at 100° C. for 30 minutes under vacuum. The printed devices exhibited a saturated hole mobility of $10^{-5}$ cm$^2$/V-s, and $I_{on}/I_{off}$~100 when measured in air (FIG. 8). Although the mobility values for these printed devices were observed to be lower than for spin-coated films, the devices functioned reproducibly as p-channel transistors. These processing advantages (in particular, the simplicity of the gravure printing technique and low annealing temperature) can, in some applications, compensate for the slightly compromised device performance.

Figure 9:
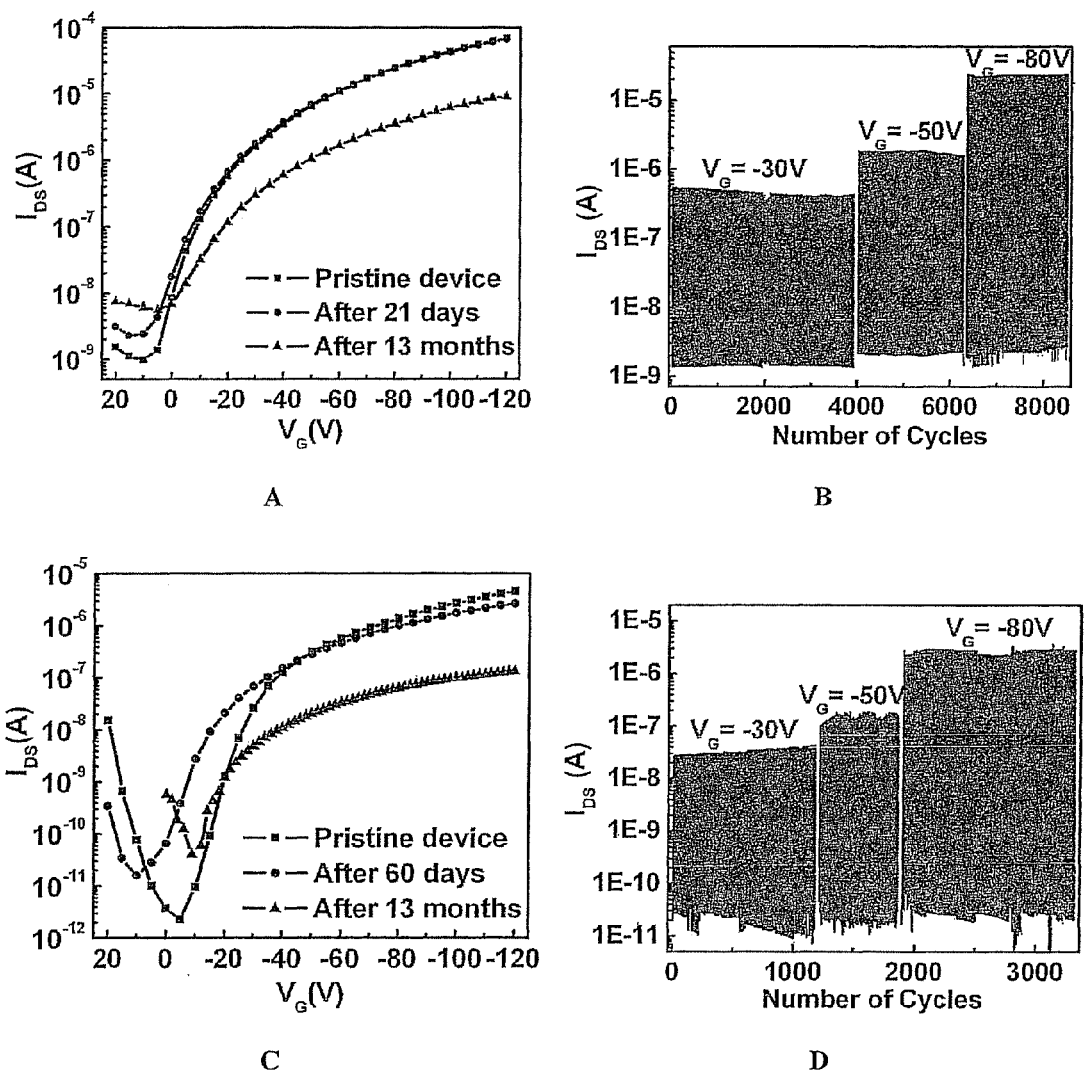
FIG. 9 shows the transfer characteristics of devices fabricated with certain embodiments of the polymers of the present teachings (i.e., polymers 2 (A), 6 (C), and 9 (E)) as a function of storage time in the air.

OFET devices fabricated using polymers of the present teachings can operate very well in air, e.g., showing both high ambient storage stability and electrical stability. For example, the off currents of devices fabricated with an embodiment of polymer 3 and exposed to air for three weeks were observed to have increased by less than one order of magnitude, while the on current maintained at the same level (FIG. 9A). By means of another example, the $I_{on}/I_{off}$ ratios of devices fabricated with an embodiment of polymer 6 were observed to have declined by less than one order of magnitude after 60 days (FIG. 9C). For devices fabricated with polymers 3 and 6, nearly identical threshold voltages, mobilities, and $I_{on}/I_{off}$ ratios were obtained, demonstrating and illustrating the excellent air stabilities of polymers of the present teachings. In fact, after one year storage under ambient conditions, including exposure to light, the $I_{on}/I_{off}$ ratios were found to be in the range of about $1\times10^3$ to about $5\times10^3$. Without wishing to be bound to any particular theory, the positive shift in threshold voltage after a few weeks can be attributed to slight p-doping by $O_2$. OFET electrical stability were also tested by repeatedly switching the device on and off in air at various gate biases. Referring to FIGS. 9B and 9D, for devices fabricated with polymers 3 and 6, the device performance evidenced little indication of degradation, with $I_{on}/I_{off}$ ratios at fixed gate voltage remaining constant.

Aspects of the present teachings can be further understood in light of the following examples, which should not be construed as limiting the scope of the present teachings in any way.

All reagents were purchased from commercial sources and used without further purification unless otherwise noted. Anhydrous THF was distilled from Na/benzophenone. Conventional Schlenk techniques were used, and reactions were carried out under $N_2$ unless otherwise noted. UV-vis spectra were recorded on a Cary Model 1 UV-Vis spectrophotometer. Fluorescent measurements were recorded on a Photon Technology International model QM-2 fluorimeter. NMR spectra were recorded on a Varian Unity Plus 500 spectrometer (1H, 500 MHz; $^{13}$C, 125 MHz). Electrospray mass spectrometry was performed with a Thermo Finnegan model LCQ Advantage mass spectrometer. Electrochemistry was performed on a C3 Cell Stand electrochemical station equipped with BAS Epsilon software (Bioanalytical Systems, Inc., Lafayette, Ind.).

Example 1

Preparation of 3,3',5,5'-tetrabromo-2,2'-bithiophene 10

Bromine (19.6 g, 122.6 mmol) was added dropwise over 1.5 h to a solution of 2,2'-bithiophene (5.57 g, 33.5 mmol) in the mixed solvent of glacial acetic acid (20 mL) and chloroform (45 mL) at 5-15° C. The mixture was subsequently stirred at room temperature for 5 h and then under reflux for 24 h. After cooling to room temperature, the reaction was quenched by adding 50 mL of an aqueous solution of 10% KOH. The mixture was extracted with CHCl$_3$ (2×100 mL), and the combined extracts were washed with water, dried over anhydrous MgSO$_4$, filtered, and the solvent removed by evaporation. Recrystallization from ethanol afforded off-white crystals in a 77% yield. $^1$H NMR (CDCl$_3$): δ 7.06 (s, 2H) ppm; $^{13}$C NMR (CDCl$_3$): δ 112.32, 115.31, 133.17 ppm.

Example 2

Preparation of 3,3'-dibromo-2,2'-bithiophene 11

3,3',5,5'-Tetrabromo-2,2'-bithiophene 10 (12.5 g, 25.9 mmol) was added in portions within 0.5 h to a refluxing dispersion of Zn powder (6.5 g, 0.1 mol) in 130 mL of ethanol containing 13 mL of water, 31 mL of glacial acetic acid, and 2.6 mL of 3 M HCl. After heating under reflux for two additional hours and then cooling to room temperature, the mixture was filtered and washed three times with ethanol, and the filtrate was collected. The solvent was then removed by evaporation, and 60 mL of H$_2$O was added. The mixture was then extracted with diethyl ether, and the combined extracts were washed with water, dried over anhydrous MgSO$_4$, and filtered. The solvent was removed by evaporation, and the crude product was recrystallized from hexane to give colorless crystals (7.6 g, yield 90%). $^1$H NMR (CDCl$_3$): 7.41 (d, J=5.3 Hz, 2H), 7.09 (d, J=5.3 Hz, 2H) ppm; $^{13}$C NMR (CDCl$_3$): δ 112.84, 127.73, 129.07, 131.01 ppm.

Example 3

Preparation of 3,3'-di-n-hexylsilylene-2,2'-bithiophene 12

To a solution of n-BuLi in hexane (60 mmol, 24 mL) in anhydrous THF (500 mL) at −78° C. was added dropwise under vigorous stirring a solution of 11 (30 mmol, 9.720 g) in anhydrous THF (100 mL) over 30 min. The mixture was then stirred at −78° C. for 1 h, resulting in a white suspension. Next, a solution of dichlorodihexylsilane (30 mmol, 8.070 g) in THF (100 mL) was added dropwise. The reaction mixture was stirred at −78° C. for five additional hours, allowed to warm to room temperature, and stirred overnight. The reaction was next quenched by adding saturated aqueous NH$_4$Cl solution (300 mL). The aqueous layer was extracted with ether (3×100 mL). The organic phases were then combined and washed with water and dried over MgSO$_4$. After filtration, the solvent was removed, and the crude product was purified by column chromatography to yield a light yellow liquid (6.8 g, 68%). $^1$H NMR (CDCl$_3$): δ 0.85-0.93 (m, 10H), 1.24-1.41 (m, 16H), 7.06 (d, 2H, J=5 Hz), 7.21 (d, 2H, J=5 Hz) ppm; $^{13}$C NMR (CDCl$_3$): δ 12.07, 14.29, 22.80, 24.37, 31.65, 33.07, 125.17, 126.85, 141.81, 149.37 ppm.

Example 4

Preparation of 5,5'-dibromo-3,3'-di-n-hexylsilylene-2,2'-bithiophene 13

To a solution of 12 (1.84 g, 5.0 mmol) in DMF (40 mL) was added NBS (1.98 g, 11.0 mmol) in one portion. The mixture was stirred at room temperature for 10 min, and water (50 mL) was then added. The mixture was next extracted with ether (3×50 mL). The combined organic phase was washed with water (50 mL) and dried over MgSO$_4$. After filtration, the ether was removed, and the product was purified by column chromatography using hexane as eluent to give a green liquid (2.38 g, 91%). $^1$H NMR (CDCl$_3$): δ 0.86-0.88 (m, 10H), 1.32-1.22 (m, 16H), 7.00 (s, 2H) ppm; $^{13}$C NMR (CDCl$_3$): δ 11.85, 14.29, 22.75, 24.19, 31.58, 33.00, 111.62, 132.35, 141.19, 149.13 ppm.

Example 5

Preparation of 5,5'-bis(trimethyltin)—3,3'-dihexyldithienosilole 14

To a solution of 12 (0.77 mmol, 0.40 g) in THF (20 mL) was added n-BuLi (1.85 mmol, 0.74 mL, 2.5 M in hexanes) dropwise at −78° C. The mixture was stirred at −78° C. for 1 h. Chlorotrimethyltin (2.4 mmol, 2.4 mL, 1.0 M in hexanes) was then added. The mixture was next allowed to warm up to room temperature and stirred for 2 h. The volatiles were removed under vacuum.

Example 6

Preparation of 4,4'-dibromo-2,2'-dinitrobiphenyl 15

To a stirring solution of 2,5-dibromonitrobenzene (24.0 g, 85.4 mmol) in DMF (110 mL) was added copper powder (12.0 g, 188.9 mmol), and the reaction mixture was heated at 125° C. After 3 h, the mixture was allowed to cool to room temperature. After most of the DMF was evaporated under high vacuum at 60° C., the residue was dissolved in benzene (400 mL) and the insoluble inorganic salts and excess copper were removed by filtration through Celite®. The filtrate was washed with water and 10% NaHCO$_3$ and evaporated to dryness to yield the crude product as yellow crystals (15.6 g, 91%). The crude product was next recrystallized from isopropanol to yield 11.0 g of pure product. The mother liquid was evaporated to one-fourth of its volume and an additional 3.9 g of pure product was recovered, giving a total yield of 14.9 g (87%). $^1$H NMR (CDCl$_3$): δ 7.17 (2H, d, J=8.0), 7.84 (2H, dd, J=8.0, 2.0), 8.39 (2H, d, J=2.0) ppm; $^{13}$C NMR (CDCl$_3$): δ 123.0, 128.2, 131.8, 132.0, 136.4, 147.5 ppm; m.p. 148° C.

Example 7

Preparation of 4,4'-dibromobiphenyl-2,2'-diamine 16

To a solution of 15 (11.0 g, 27.4 mmol) in 135 mL of absolute ethanol was added 32% w/w aqueous HCl (78.0 mL). Tin powder (13.0 g, 108.5 mmol) was then added in portions over 10 min, and the reaction mixture was heated to reflux at 100° C. for 2 h. After cooling, the mixture was poured into ice water (400 mL) and then made alkaline with 20% w/w aqueous NaOH solution until the pH was 9.0. The product was next extracted with diethyl ether and the organic layer was washed with brine, dried over anhydrous Na$_2$SO$_4$, filtered, and then evaporated to dryness to give pure product as light-brown crystals that could be used without further purification (8.6 g, 92%). $^1$H NMR (CDCl$_3$): δ 6.92 (6H, s), 3.78 (4H, br s, NH$_2$) ppm; $^{13}$C NMR (CDCl$_3$): δ 118.2, 121.9, 122.1, 122.8, 132.4, 145.3 ppm; m.p. 118-119° C.

Example 8

Preparation of 4,4'-dibromo-2,2'-diiodobiphenyl 17

A solution of 16 (16 g, 46.8 mmol) and concentrated HCl (56.0 mL) in water (64.0 mL) was cooled to 0° C. 8.0 g (0.106 mmol) of NaNO$_2$ in 40 mL of water was added dropwise to the diamine solution over a period of 30 min, keeping the temperature at 0° C. After the addition of NaNO$_2$ was complete, the resulting mixture was stirred for an additional 30 min. Aqueous solution of KI (77.7 g in 150 mL of water) at −5° C. was added dropwise over 30 min. The reaction mixture was then stirred (by a mechanical stirrer) for 1 h at room temperature and 3 h at 60° C., giving a dark brown solution. The solution was then cooled to 25° C. and the brown precipitate was collected by filtration. The crude brown solid was then purified by column chromatography (silica gel, hexane) yielding the title compound as a white solid (7.4 g, 28%). Elemental Anal.: C, 26.1; H, 1.2; I, 46.2; $^1$H NMR (CDCl$_3$): δ 7.04 (2H, d, J=8.0), 7.57 (2H, d, J=8.0), 8.11 (2H, s) ppm; $^{13}$C NMR (CDCl$_3$): δ 99.9, 122.4, 130.8, 131.3, 141.2, 146.6 ppm; m.p. 91° C.

Example 9

Preparation of 2,7-dibromo-9,9-dioctyldibenzosilole 18 n-Butyllithium (17.0 mL, 42.5 mmol, 2.5 M in hexane) was added in portions over 2 h to a stirring solution of 17 (6.0 g, 10.64 mmol) in dry THF (120 mL) at −78° C., under a nitrogen atmosphere. The mixture was next stirred for an additional 1 h at −78° C. Dichlorodioctylsilane (7.4 mL, 21.37 mmol) was subsequently added and the temperature of the mixture was raised to room temperature and stirred overnight. The reaction mixture was then quenched with distilled water (30.0 mL), and the solvent was removed under vacuum. The product was then dissolved in diethyl ether and the organic layer washed with brine, dried over anhydrous MgSO$_4$, filtered, and evaporated in vacuo giving 8.5 g of crude product as a brownish oil. Purification by column chromatography (silica gel, hexane) yielded the title compound as a colorless oil (4.2 g, 70%) Elemental Anal.: C, 60.4; H, 7.4; $^1$H NMR (CDCl$_3$): δ 0.91 (6H, t, CH$_3$), 0.98 (4H, t, CH$_2$), 1.23-1.38 (24H, m, CH$_2$), 7.53 (2H, dd, J=8.0, 1.5), 7.63 (2H, d, J=8.0), 7.68 (2H, d, J=1.5) ppm; $^{13}$C NMR (CDCl$_3$): δ 12.2, 14.3, 22.9, 23.9, 29.2, 29.4, 32.0, 33.5, 122.4, 122.6, 133.2, 136.0, 140.6, 146.2 ppm; $^{29}$Si NMR (CDCl$_3$): δ 4.4 ppm.

Example 10

Preparation of 2,7-bis(4,4,5,5-tetramethyl-1,3,2-dioxaborolan-2-yl)-9,9-dioctyldibenzosilole 19

Tert-BuLi (4.6 mL, 7.81 mmol, 1.7 M in pentane) was added over 30 min to a solution of 16 (1.05 g, 1.86 mmol) in dry THF (15 mL) at −78° C. under N$_2$. The mixture was stirred at −78° C. for a further 15 minutes, and 2-isopropoxy-4,4,5,5-tetramethyl[1,3,2]dioxaborolane (0.95 mL, 4.65 mmol) was subsequently added dropwise to the mixture upon continued stirring at 25° C. overnight. The reaction was then quenched with distilled water, and THF was removed under vacuum. The product was then extracted into diethyl ether and the organic layer washed with brine, dried over MgSO$_4$, filtered and evaporated in vacuo giving 8.5 g of the pure product as a white solid (0.97 g, 80%). $^1$H NMR (CDCl$_3$): δ 0.92 (6H, t, CH$_3$), 0.96 (4H, t, CH$_2$), 1.22-1.38 (24H, m, CH$_2$), 1.38 (24H, s, CH$_3$), 7.82 (2H, d, J=7.0), 7.85 (2H, d, J=7.0), 8.08 (2H, s) ppm; $^{29}$Si NMR (CDCl$_3$): δ 3.3 ppm.

Example 11

Preparation of TS6 (1)

A solution of 5,5'-dibromo-3,3'-dihexyldithienosilole 13 (0.77 mmol, 0.40 g) and the catalyst Pd(PPh$_3$)$_2$Cl$_2$ (55 mg) in THF (20 mL) was combined under inert nitrogen atmosphere and the preparation was heated under reflux for 8 days, resulting in a dark suspension. The mixture was then cooled and water (30 mL) was added. The aqueous layer was extracted with $CH_2Cl_2$ (2×30 mL). The combined organic layer was washed with water (40 mL) and dried over $MgSO_4$. The solvent was removed, and the residue was dissolved in THF and boiling methanol was added dropwise, resulting in a black suspension. The precipitate was collected via filtration, redissolved in THF, and precipitated by methanol again to give a black chunky solid (0.37 g, 66%). GPC: $M_w=2.6\times10^4$, PDI=2.9; NMR: $^1$H ($CDCl_2CDCl_2$): δ 7.06 (br, 2H), 1.35 (m, 4H), 1.17 (m, 16H), 0.80 (s, 6H); $^{13}$C ($CDCl_2CDCl_2$): δ 146.92, 142.53, 138.01, 125.40, 32.44, 30.92, 23.60, 22.07, 13.61, 11.34; Elemental Anal.: C, 66.14; H, 7.08.

Example 12

Preparation of TS6T1 (2)

The reagent 2,5-bis(trimethlystannyl)thiophene (1.5 mmol, 0.614 g), 13 (1.5 mmol, 0.78 g), and $Pd(PPh_3)_2Cl_2$ (50 mg) in anhydrous THF (50 mL) were heated at reflux with stirring under nitrogen for 7 days. The heating was then discontinued, and the reaction mixture was allowed to cool to room temperature, and was poured into methanol (800 mL). The nearly black precipitate was collected via filtration, and was further purified by precipitation from methanol/THF twice to yield a deep purple solid (0.52 g, 81%). GPC: $M_w=30500$, PDI=2.9; $^1$H NMR ($Cl_2CDCDCl_2$): δ 0.81 (br, 6H), 1.20-1.36 (br, 20H), 7.02-7.08 (br, 4H) ppm; Elemental Anal.: C, 65.11; H, 6.90.

Example 13

Preparation of TS6T2 (3)

The reagent 2,5'-bis(trimethlystannyl)-2,2'-bithiophene (1.5 mmol, 0.74 g), 13 (1.5 mmol, 0.78 g), and $Pd(PPh_3)_2Cl_2$ (50 mg) in anhydrous THF (50 mL) were heated at reflux under nitrogen for 7 days. The heating was then discontinued; and the reaction mixture was allowed to cool to room temperature and was poured into methanol (800 mL). The black precipitate was collected via filtration, and was further purified by precipitation from methanol/THF twice to yield a deep purple solid (0.65 g, 83%). GPC: $M_w=40700$, PDI=3.0; $^1$H NMR ($Cl_2CDCDCl_2$): δ 0.80-0.87 (br, 6H), 1.19-1.34 (br, 20H), 7.02-7.08 (br, 4H); Elemental Anal.: C, 64.04, H, 6.08.

Example 14

Preparation of BS8 (4)

A mixture of 19 (315.0 mg, 0.478 mmol), 18 (270.0 mg, 0.478 mmol) and Aliquat 336 (0.040 g) was degassed thrice with $N_2$ before 2.5 mL of dry toluene was added. Tetrakis(triphenylphosphine)palladium (7.3 mg, 0.007 mmol) and an aqueous solution of 2M sodium carbonate (0.95 ml, deaerated for 2 h) was added under $N_2$. The mixture was stirred vigorously and heated at reflux for 2 days. The highly viscous reaction mixture was poured into boiling methanol (15 mL), precipitating a pale-green polymer. The polymer is collected by filtration and washed with acetone, methanol, water, and dried in vacuum at 70° C. overnight. The polymer was then dissolved in boiling THF (400 mg in 20 ml of THF), filtered, and reprecipitated with 80 mL of methanol to give 300 mg of the title product as a pale green polymer (76%). GPC: $M_w=32210$, PDI=3.4; $^1$H NMR ($Cl_2CDCDCl_2$): δ 0.6-1.6 (br, $CH_2+CH_3$), 6.3-7.0 (m, ArH), 7.5-8.0 (m, ArH) ppm; Elemental Anal.: C, 82.68; H, 10.44.

Example 15

Preparation of BS8T1 (5)

A mixture of 18 (564.5 mg, 1.0 mmol), 2,5-bis(4,4,5,5-tetramethyl-1,3,2-dioxaborolan-2-yl)thiophene (336.0 mg, 1.0 mmol), and Aliquat 336 (0.084 g) was degassed thrice with $N_2$ before 7.0 mL of dry toluene was added. Tetrakis(triphenylphosphine)palladium (15.0 mg, 0.014 mmol) and an aqueous solution of 2M sodium carbonate (1.95 mL, deaerated for 2 h) was added under $N_2$. The mixture was stirred vigorously, and heated at reflux for 2 days. The highly viscous reaction mixture was next poured into boiling acetone (13 mL), precipitating an orange polymer. The polymer was collected by filtration and washed with acetone, methanol, water, and dried in vacuum at 60° C. overnight. The polymer was next dissolved in boiling trichlorobenzene and reprecipitated with 100 mL of methanol twice to give 292 mg of the title product as a pure green polymer (60%). GPC: $M_w=112000$, PDI=3.1; $^1$H NMR ($CDCl_3$): δ 7.41-7.73 (8H, br, ArH), 0.86-1.40 (34H, m, $CH_2+CH_3$) ppm; Elemental Anal.: C, 78.58; H, 8.97.

Example 16

Preparation of BS8T2 (6)

A mixture of 18 (193.0 mg, 0.354 mmol), 2,5'-bis(4,4,5,5-tetramethyl-1,3,2-dioxaborolan-2-yl)bithiophene (148.0 mg, 0.354 mmol), and Aliquat 336 (0.03 g) was degassed thrice with $N_2$ before 2.5 mL of dry toluene was added. Tetrakis(triphenylphosphine)palladium (5.3 mg, 0.005 mmol) and an aqueous solution of 2M sodium carbonate (0.7 mL, deaerated for 2 h) was added under $N_2$. The mixture was stirred vigorously and heated at reflux for 2 days. The highly viscous reaction mixture was then poured into a boiling acetone (13 mL), precipitating an orange polymer. The polymer was collected by filtration and washed with acetone, methanol, water, and dried in vacuum at 60° C. overnight. The polymer was next dissolved in boiling trichlorobenzene (170 mg in 9 mL of TCB) and reprecipitated with 40 mL of methanol twice to give 140 mg of the title product as a pure orange polymer (45%). GPC: $M_w=127000$, PDI=3.7; $^1$H NMR ($Cl_2CDCDCl_2$): δ 7.01-7.85 (10H, br, ArH), 0.86-1.45 (34H, m, $CH_2+CH_3$) ppm; Elemental Anal.: C, 75.68; H, 7.84.

Comparative Example 1

Preparation of F8T1 (7)

A mixture of 19 (530.0 mg, 1.0 mmol), 2,5-dibromothiophene (242.0 mg, 1.0 mmol), and Aliquat 336 (0.084 g) was degassed 3 times with $N_2$ before 7 mL of dry toluene was added. Tetrakis(triphenylphosphine)palladium (15.0 mg, 0.014 mmol) and an aqueous solution of 2M sodium carbonate (1.95 mL, deaerated for 2 h) was added under $N_2$. The mixture was stirred vigorously and heated at reflux for 2 days. The reaction mixture was next poured into boiling acetone (20 mL), precipitating a green polymer. The polymer was collected by filtration and washed with acetone, methanol, water, and dried in vacuum at 60° C. overnight. The polymer was dissolved in boiling toluene and reprecipitated with 40 mL of methanol thrice to give 260 mg of the title product as a pure green polymer (55%). GPC: $M_w$=17755, PDI=2.6; Anal. Calcd. for $(C_{33}H_{42}S)_n$: C, 84.20; H, 8.99; found: C, 84.31; H, 9.41.

Comparative Example 2

Preparation of F8T2 (8)

A mixture of 19 (800.0 mg, 1.5 mmol) and 5,5'-dibromo-2,2'-bithiophene (489.0 mg, 1.5 mmol) and Aliquat 336 (0.12 g) was degassed 3 times with $N_2$ before 10 mL of dry toluene was added. Tetrakis(triphenylphosphine)palladium (23.0 mg, 0.021 mmol) and an aqueous solution of 2M sodium carbonate (2.95 mL, deaerated for 2 h) was added under $N_2$. The mixture was stirred vigorously and heated at reflux for 2 days. The highly viscous reaction mixture was next poured into boiling methanol (30 mL), precipitating a yellow fibrous polymer. The polymer was collected by filtration and washed with acetone, methanol, water, and dried in vacuum at 60° C. overnight. The polymer was dissolved in boiling toluene and reprecipitated with 50.0 mL of methanol thrice to give 660.0 mg of the title product as a pure yellow fibrous polymer (79%). GPC: $M_w$=80000, PD=3.3; Anal. Calcd. for $(C_{37}H_{44}S_2)_n$: C, 80.38; H, 8.02; found: C, 80.68; H, 8.14.

Example 17

Thin-Film Transistor Device Fabrication and Thin Film Characterization

Prime-grade n-doped silicon wafers (100) having 300 nm thermally grown oxide (Process Specialties Inc.) were used as device substrates. These were rinsed with water, methanol, and acetone before film deposition. Trimethylsilyl functionalization of the $Si/SiO_2$ surface was carried out by exposing the silicon wafers to hexamethyldisilazane (HMDS) vapor at room temperature in a closed container under nitrogen overnight. Polymer films were spin-coated from 0.5% (w/v) THF or 1,2,4-trichlorobenzene solutions and then annealed under nitrogen at 230-250° C. for 30 min. Spin-coated films were 25-30 nm-thick as assessed by profilometry. For FET device fabrication, top-contact electrodes (500 Å) were deposited by evaporating gold (pressure<$10^{-5}$ Torr); channel dimensions were 25/50/100 μm (L) by 0.2/1.0/2.5/5.0 mm (W). The capacitance of the insulator is $1\times10^{-8}$ F/$cm^2$ for 300 nm $SiO_2$. TFT device measurements were carried out in a customized vacuum probe station ($8\times10^{-5}$ Torr) or in air. Coaxial and/or triaxial shielding was incorporated into Signaton probes to minimize the noise level. TFT characterization was performed with a Keithly 6430 subfemtoammeter and a Keithly 2400 source meter, operated by a locally written Labview program and GPIB communication. Thin films were analyzed by wide-angle X-ray film diffractometry (WAXRD) on a Rikagu ATX-G instrument using standard 0-20 techniques, with Cu Kα radiation and a monochromator. All 0-20 scans were calibrated in situ with the reflection of the Si (100) substrates.

Example 18

Electrochemistry

Cyclic voltammetry measurements were performed in an electrolyte solution of 0.1 M tetrabutylammonium hexafluorophosphate ($Bu_4NPF_6$) in dry acetonitrile. Platinum wire electrodes were used as both working and counter electrodes, and Ag wire was used as the pseudo-reference electrode. A ferrocene/ferrocenium redox couple was used as an internal standard and potentials obtained in reference to a silver electrode were converted to the saturated calomel electrode (SCE) scale. Thin films of the polymers were coated onto the Pt working electrode by drop-casting from 0.5-1.0 wt % THF solutions and dried under vacuum at 80° C. for 2 h.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A polymer comprising a first repeating unit of the formula:

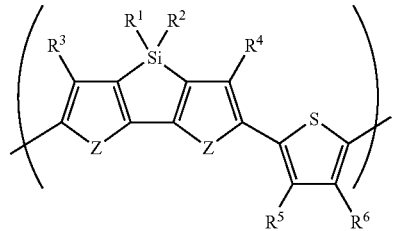

and a second repeating unit comprising one or more optionally substituted 5-14 membered heteroaryl groups, one or more optionally substituted $C_{6-14}$ aryl groups, or combinations thereof, wherein:

Z is S or $CR^8$=$CR^9$;

$R^1$ and $R^2$ independently are a) H, b) a $C_{1-20}$ alkyl group, c) a $C_{2-20}$ alkenyl group, d) a $C_{2-20}$ alkynyl group, e) a $C_{1-20}$ haloalkyl group, f) a —Y—$C_{3-14}$ cycloalkyl group, g) a —Y—$C_{6-14}$ aryl group, h) a —Y-3-14 membered cycloheteroalkyl group, or i) a —Y-5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^3$, $R^4$, $R^5$, and $R^6$ independently are a) H, b) halogen, c) —CN, d) —$NO_2$, e) —OH, f) —$NH_2$, g) —SH, h) —C(O)OH, i) —C(O)$NH_2$, j) —S(O)$_2$OH, k) —O$C_{1-20}$ alkyl, l) —NH—$C_{1-20}$ alkyl, m) —N($C_{1-20}$ alkyl)$_2$, n) —C(O)—$C_{1-20}$ alkyl, o) —C(O)—O$C_{1-20}$ alkyl, p) —C(O)NH—$C_{1-20}$ alkyl, q) —C(O)N($C_{1-20}$ alkyl)$_2$, r) —S(O)$_m$—$C_{1-20}$ alkyl, s) —S(O)$_m$—O$C_{1-20}$ alkyl, t) —S(O)$_m$—NH$C_{1-20}$ alkyl, u) —S(O)$_m$—N($C_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group, wherein each of the $C_{1-20}$ alkyl groups, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups, provided that at least one of $R^5$ and $R^6$ is not H;

R⁸ and R⁹ independently are a) H, b) halogen, c) —CN, d) —NO₂, e) —OH, f) —NH₂, g) —SH, h) —C(O)OH, i) —C(O)NH₂, j) —S(O)₂OH, k) —OC$_{1-20}$ alkyl, l) —NH—C$_{1-20}$ alkyl, m) —N(C$_{1-20}$ alkyl)₂, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)₂, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)₂, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R¹⁰ groups;

R¹⁰, at each occurrence, independently is a) halogen, b) —NO₂, c) —CN, d) oxo, e) —OH, f) —NH₂, g) —SH, h) —C(O)OH, i) —C(O)NH₂, j) —S(O)₂OH, k) —OC$_{1-20}$ alkyl, l) —NH—C$_{1-20}$ alkyl, m) —N(C$_{1-20}$ alkyl)₂, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)₂, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$alkyl)₂, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group;

Y, at each occurrence, independently is a) a divalent C$_{1-20}$ alkyl group, b) a divalent C$_{2-20}$ alkenyl group, c) a divalent C$_{2-20}$ alkynyl group, d) a divalent C$_{1-20}$ haloalkyl group, or e) a covalent bond; and m, at each occurrence, independently is 0, 1, or 2.

2. The polymer of claim 1, wherein Z is S or CH=CH.

3. The polymer of claim 1, wherein R¹ and R² independently are a C$_{1-20}$ alkyl group optionally substituted with 1-4-Y—R¹⁰ groups.

4. The polymer of claim 1, wherein at least one of R³, R⁴, R⁵, and R⁶ is H.

5. The polymer of claim 1, wherein R¹ and R² independently are a hexyl group or an octyl group.

6. The polymer of claim 1, wherein the second repeating unit comprises one or more optionally substituted polycyclic 8-14 membered heteroaryl groups.

7. The polymer of claim 1, wherein the second repeating unit comprises an optionally substituted polycyclic heteroaryl group, wherein the optionally substituted polycyclic heteroaryl group comprises an optionally substituted thienyl group fused with an optionally substituted 5- or 6-membered heteroaryl group.

8. The polymer of claim 7, wherein the second repeating unit is:

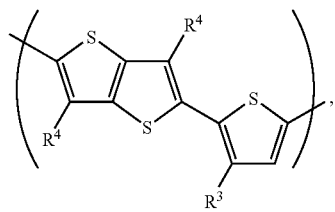

wherein R³ and R⁴ a) H, b) halogen, c) —CN, d) —NO₂, e) —OH, f) —NH₂, g) —SH, h) —C(O)OH, i) —C(O)NH₂, j) —S(O)₂OH, k) —OC$_{1-20}$ alkyl, l) —NH—C$_{1-20}$ alkyl, m) —N(C$_{1-20}$ alkyl)₂, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)₂, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)₂, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R¹⁰ groups;

R¹⁰, at each occurrence, independently is a) halogen, b) —NO₂, c) —CN, d) oxo, e) —OH, f) —NH₂, g) —SH, h) —C(O)OH, i) —C(O)NH₂, j) —S(O)₂OH, k) —OC$_{1-20}$ alkyl, l) —NH—C$_{1-20}$ alkyl, m) —N(C$_{1-20}$ alkyl)₂, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)₂, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)₂, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group;

Y, at each occurrence, independently is a) a divalent C$_{1-20}$ alkyl group, b) a divalent C$_{2-20}$ alkenyl group, c) a divalent C$_{2-20}$ alkynyl group, d) a divalent C$_{1-20}$ haloalkyl group, or e) a covalent bond; and m, at each occurrence, independently is 0, 1, or 2.

9. The polymer of claim 1, wherein the second repeating unit comprises one or more optionally substituted phenyl groups.

10. The polymer of claim 9, wherein the second repeating unit is selected from:

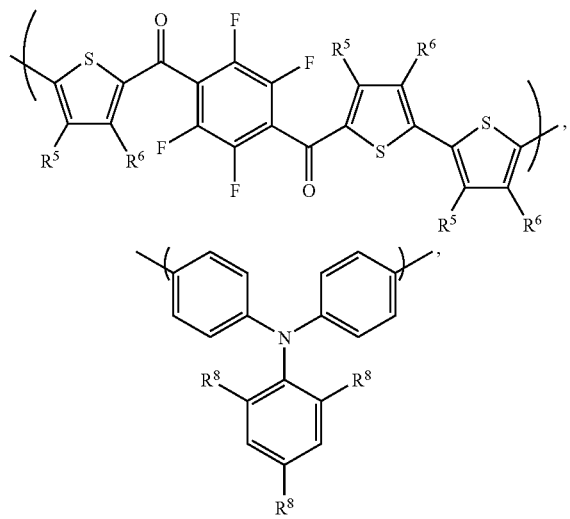

wherein R⁵, and R⁶ independently are a) H, b) halogen, c) —CN, d) —NO₂, e) —OH, f) —NH₂, g) —SH, h) —C(O)OH, i) —C(O)NH₂, j) —S(O)₂OH, k) OC$_{1-20}$ alkyl, l) —NH—C$_{1-20}$ alkyl, m) —N(C$_{1-20}$ alkyl)₂, n)

—C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R$^{10}$ groups;

R$^8$ is a) H, b) halogen, c) —CN, d) —NO$_2$, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R$^{10}$ groups;

R$^{10}$, at each occurrence, independently is a) halogen, b) —NO$_2$, c) —CN, d) oxo, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group;

Y, at each occurrence, independently is a) a divalent C$_{1-20}$ alkyl group, b) a divalent C$_{2-20}$ alkenyl group, c) a divalent C$_{2-20}$ alkynyl group, d) a divalent C$_{1-20}$ haloalkyl group, or e) a covalent bond; and m, at each occurrence, independently is 0, 1, or 2.

11. A composition comprising one or more polymers of claim 1 dissolved in an organic solvent or a mixture of solvents.

12. A thin film semiconductor comprising one or more polymers of claim 1.

13. A composite comprising a substrate and the thin film semiconductor of claim 12 deposited on the substrate.

14. An organic field effect transistor device comprising the thin film semiconductor of claim 12.

15. An organic light-emitting diode comprising the thin film semiconductor of claim 12.

16. An organic photovoltaic device comprising the thin film semiconductor of claim 12.

17. A polymer comprising a first repeating unit of the formula:

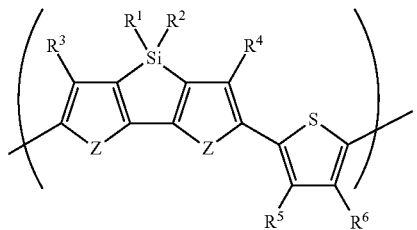

and a second repeating unit comprising one or more optionally substituted 5-14 membered heteroaryl groups, one or more optionally substituted C$_{6-14}$ aryl groups, or combinations thereof, wherein:

Z is S or CR$^8$=CR$^9$;

R$^1$ and R$^2$ independently are a C$_{1-20}$ alkyl group optionally substituted with 1-4-Y—R$^{10}$ groups;

R$^3$, R$^4$, R$^5$, and R$^6$ independently are a) H, b) halogen, c) —CN, d) —NO$_2$, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R$^{10}$ groups;

R$^8$ and R$^9$ independently are a) H, b) halogen, c) —CN, d) —NO$_2$, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group, wherein each of the C$_{1-20}$ alkyl groups, the C$_{2-20}$ alkenyl group, the C$_{2-20}$ alkynyl group, the C$_{1-20}$ haloalkyl group, the C$_{3-14}$ cycloalkyl group, the C$_{6-14}$ aryl group, the 3-14 membered cycloheteroalkyl group, and the 5-14 membered heteroaryl group optionally is substituted with 1-4-Y—R$^{10}$ groups;

R$^{10}$, at each occurrence, independently is a) halogen, b) —NO$_2$, c) —CN, d) oxo, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$alkyl)$_2$, v) a C$_{1-20}$ alkyl group, w) a C$_{2-20}$ alkenyl group, x) a C$_{2-20}$ alkynyl group, y) a C$_{1-20}$ haloalkyl group, z) a C$_{3-14}$ cycloalkyl group, aa) a C$_{6-14}$ aryl group, ab) a 3-14 membered cycloheteroalkyl group, or ac) a 5-14 membered heteroaryl group;

Y, at each occurrence, independently is a) a divalent $C_{1-20}$ alkyl group, b) a divalent $C_{2-20}$ alkenyl group, c) a divalent $C_{2-20}$ alkynyl group, d) a divalent $C_{1-20}$ haloalkyl group, or e) a covalent bond; and m, at each occurrence, independently is 0, 1, or 2.

18. The polymer of claim 17, wherein the first repeating unit has the formula:

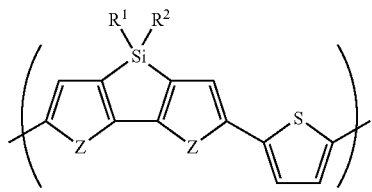

wherein $R^1$, $R^2$, and Z are as defined in claim 17.

19. The polymer of claim 17, wherein the first repeating unit is selected from:

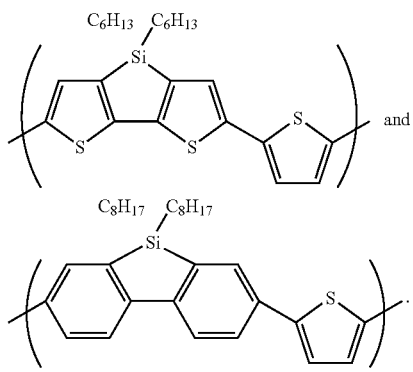

20. A polymer comprising a first repeating unit of the formula:

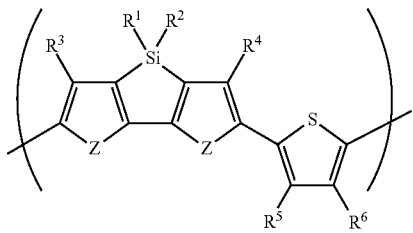

and a second repeating unit comprising one or more optionally substituted polycyclic 8-14 membered heteroaryl groups, wherein:

Z is S or $CR^8=CR^9$;

$R^1$ and $R^2$ independently are a) H, b) a $C_{1-20}$ alkyl group, c) a $C_{2-20}$ alkenyl group, d) a $C_{2-20}$ alkynyl group, e) a $C_{1-20}$ haloalkyl group, f) a —Y—$C_{3-14}$ cycloalkyl group, g) a —Y—$C_{6-14}$ aryl group, h) a —Y-3-14 membered cycloheteroalkyl group, or i) a —Y-5-14 membered heteroaryl group, wherein each of the $C_{1-20}$ alkyl group, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^3$, $R^4$, $R^5$, and $R^6$ independently are a) H, b) halogen, c) —CN, d) —NO$_2$, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group, wherein each of the $C_{1-20}$ alkyl groups, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^8$ and $R^9$ independently are a) H, b) halogen, c) —CN, d) —NO$_2$, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$ alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group, wherein each of the $C_{1-20}$ alkyl groups, the $C_{2-20}$ alkenyl group, the $C_{2-20}$ alkynyl group, the $C_{1-20}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-4-Y—$R^{10}$ groups;

$R^{10}$, at each occurrence, independently is a) halogen, b) —NO$_2$, c) —CN, d) oxo, e) —OH, f) —NH$_2$, g) —SH, h) —C(O)OH, i) —C(O)NH$_2$, j) —S(O)$_2$OH, k) —OC$_{1-20}$ alkyl, l) —NH—C$_{1-20}$ alkyl, m) —N(C$_{1-20}$ alkyl)$_2$, n) —C(O)—C$_{1-20}$ alkyl, o) —C(O)—OC$_{1-20}$ alkyl, p) —C(O)NH—C$_{1-20}$ alkyl, q) —C(O)N(C$_{1-20}$ alkyl)$_2$, r) —S(O)$_m$—C$_{1-20}$ alkyl, s) —S(O)$_m$—OC$_{1-20}$ alkyl, t) —S(O)$_m$—NHC$_{1-20}$ alkyl, u) —S(O)$_m$—N(C$_{1-20}$alkyl)$_2$, v) a $C_{1-20}$ alkyl group, w) a $C_{2-20}$ alkenyl group, x) a $C_{2-20}$ alkynyl group, y) a $C_{1-20}$ haloalkyl group, z) a $C_{3-14}$ cycloalkyl group, aa) a $C_{6-14}$ aryl group, ab) a 3-14 membered cycloheteroalkyl group, or ac) a 5-14 membered heteroaryl group;

Y, at each occurrence, independently is a) a divalent $C_{1-20}$ alkyl group, b) a divalent $C_{2-20}$ alkenyl group, c) a divalent $C_{2-20}$ alkynyl group, d) a divalent $C_{1-20}$ haloalkyl group, or e) a covalent bond; and m, at each occurrence, independently is 0, 1, or 2.

21. The polymer of claim 20, wherein the optionally substituted polycyclic heteroaryl group of the second repeating unit comprises an optionally substituted thienyl group fused with an optionally substituted 5- or 6-membered heteroaryl group.

22. The polymer of claim 20, wherein the second repeating unit is selected from

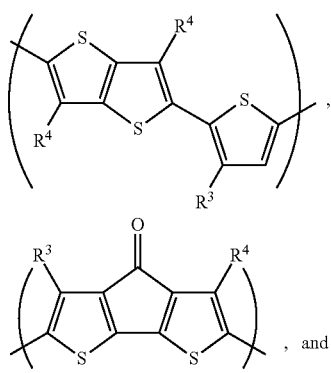, 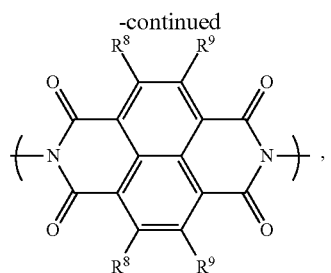,
wherein $R^3$, $R^4$, $R^5$, $R^6$, $R^8$, and $R^9$ are as defined in claim 20.
* * * * *

UNITED STATES PATENT AND TRADEMARK OFFICE
CERTIFICATE OF CORRECTION

| | | Page 1 of 1 |
|---|---|---|
| PATENT NO. | : 7,816,480 B2 | |
| APPLICATION NO. | : 12/563680 | |
| DATED | : October 19, 2010 | |
| INVENTOR(S) | : Marks et al. | |

It is certified that error appears in the above-identified patent and that said Letters Patent is hereby corrected as shown below:

At column 1, under the heading "STATEMENT REGARDING FEDERALLY SPONSORED RESEARCH OR DEVELOPMENT," delete the paragraph beginning with "This invention, in part, was made" and ending with "has certain rights in this invention" and replace it with the following paragraph:

--This invention was made with government support under Grant Number NCC-2-1363 awarded by the National Aeronautics and Space Administration (NASA), Grant Numbers N00014-02-1-0909 and N00014-05-1-0021 awarded by the Office of Naval Research, and Grant Number DMR-0076097 awarded by the National Science Foundation. The government has certain rights in the invention.--

Signed and Sealed this
Eighteenth Day of January, 2011

David J. Kappos
*Director of the United States Patent and Trademark Office*